United States Patent
Maenishi et al.

(10) Patent No.: US 6,842,974 B1
(45) Date of Patent: Jan. 18, 2005

(54) COMPONENT MOUNTING METHOD AND COMPONENT MOUNTING APPARATUS

(75) Inventors: Yasuhiro Maenishi, Kofu (JP); Takahiro Inoue, Kofu (JP); Ikuo Yoshida, Kofu (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 67 days.

(21) Appl. No.: 10/088,759

(22) PCT Filed: Sep. 26, 2000

(86) PCT No.: PCT/JP00/06598
§ 371 (c)(1),
(2), (4) Date: Mar. 22, 2002

(87) PCT Pub. No.: WO01/24598
PCT Pub. Date: Apr. 5, 2001

(30) Foreign Application Priority Data

Sep. 27, 1999 (JP) .......................................... 11/273111
Sep. 22, 2000 (JP) ....................................... 2000-288806

(51) Int. Cl.$^7$ .............................................. H05K 3/30
(52) U.S. Cl. ............................. 29/832; 29/739; 29/740; 29/833; 29/840
(58) Field of Search ......................... 29/739, 740, 832, 29/833, 840, 841, 564.1, 705

(56) References Cited

U.S. PATENT DOCUMENTS

| | | | | |
|---|---|---|---|---|
| 3,337,941 A | * | 8/1967 | Drop ........................... | 29/705 |
| 4,480,780 A | * | 11/1984 | Claeskens et al. ..... | 228/180.21 |
| 4,615,093 A | * | 10/1986 | Tews et al. .............. | 29/407.04 |
| 4,631,816 A | * | 12/1986 | Fujita et al. ................... | 29/740 |
| 4,881,319 A | * | 11/1989 | Yagi et al. ..................... | 29/840 |
| 5,040,291 A | * | 8/1991 | Janisiewicz et al. .......... | 29/840 |
| 5,377,405 A | * | 1/1995 | Sakurai et al. ................ | 29/833 |
| 5,491,888 A | * | 2/1996 | Sakurai et al. ................ | 29/832 |
| 5,566,447 A | * | 10/1996 | Sakurai ........................ | 29/832 |
| 5,639,203 A | | 6/1997 | Lee | |
| 5,839,769 A | | 11/1998 | Slocum et al. | |
| 5,862,586 A | * | 1/1999 | Kimura ........................ | 29/832 |
| 5,894,657 A | * | 4/1999 | Kanayama et al. ........... | 29/740 |
| 6,044,169 A | * | 3/2000 | Hirotani et al. ............. | 382/145 |
| 6,408,505 B1 | * | 6/2002 | Hata et al. .................... | 29/740 |

FOREIGN PATENT DOCUMENTS

| | | |
|---|---|---|
| JP | 62-169423 | 7/1987 |
| JP | 64-5100 | 1/1989 |
| JP | 64-47100 | 2/1989 |
| JP | 1-103709 | 4/1989 |
| JP | 3-211117 | 9/1991 |
| JP | 6-140796 | 5/1994 |
| WO | 99/31948 | 6/1999 |

* cited by examiner

*Primary Examiner*—Carl J. Arbes
(74) *Attorney, Agent, or Firm*—Wenderoth, Lind & Ponack, L.L.P.

(57) ABSTRACT

An electronic component mounting method for placing electronic components successively to component placing positions on a board by component holding devices equipped with a plurality of removable suction nozzles which is operable to hold the electronic components. The method, as an example of its various manners, includes: in placing the electronic components onto a multiple board composed of a plurality of sub-boards, applying a placement step to all the sub-boards, the placement step being a step of placing onto the board all of electronic components that are holdable by an identical suction nozzle; and after completion of the placement step, changing the suction nozzle to another and moving to a next placement step, whereby electronic-component mounting for the individual sub-boards is carried out. In another aspect, component array intervals (M) of component feed sections or intervals (N) of component placing positions on the board are made coincident with array intervals (L) of the component holding devices.

19 Claims, 21 Drawing Sheets

FIRST PATTERN | SECOND PATTERN | THIRD PATTERN

⊘ NOZZLE CHANGE

Fig.5

TASK REPEAT METHOD

| | SUB-BOARD | COMPONENT | PLACEMENT HEAD NO. | SUCTION NOZZLE |
|---|---|---|---|---|
| 1 | 1 | C1 | 1 | S |
| 2 | 1 | C2 | 2 | S |
| 3 | 1 | C3 | 3 | S |
| 4 | 1 | C4 | 4 | S |
| 5 | 2 | C5 | 1 | S |
| 6 | 2 | C6 | 2 | S |
| 7 | 2 | C7 | 3 | S |
| 8 | 2 | C8 | 4 | S |
| 9 | 3 | C9 | 1 | S |
| 10 | 3 | C10 | 2 | S |
| 11 | 3 | C11 | 3 | S |
| 12 | 3 | C12 | 4 | S |
| 13 | 1 | SOP1 | 1 | M |
| 14 | | − | 2 | − |
| 15 | | − | 3 | − |
| 16 | | − | 4 | − |
| 17 | 2 | SOP2 | 1 | M |
| 18 | | − | 2 | − |
| 19 | | − | 3 | − |
| 20 | | − | 4 | − |
| 21 | 3 | SOP3 | 1 | M |
| 22 | | − | 2 | − |
| 23 | | − | 3 | − |
| 24 | | − | 4 | − |
| 25 | 1 | QFP1 | 1 | L |
| 26 | | − | 2 | − |
| 27 | | − | 3 | − |
| 28 | | − | 4 | − |
| 29 | 2 | QFP2 | 1 | L |
| 30 | | − | 2 | − |
| 31 | | − | 3 | − |
| 32 | | − | 4 | − |
| 33 | 3 | QFP3 | 1 | L |
| 34 | | − | 2 | − |
| 35 | | − | 3 | − |
| 36 | | − | 4 | − |

FIRST PATTERN    SECOND PATTERN    THIRD PATTERN

◎ NOZZLE CHANGE

Fig.8

IMPROVED STEP REPEAT METHOD

| | SUB-BOARD | COMPONENT | PLACEMENT HEAD NO. | SUCTION NOZZLE |
|---|---|---|---|---|
| 1 | 1 | C1 | 1 | S |
| 2 | 2 | C5 | 2 | S |
| 3 | 3 | C9 | 3 | S |
| 4 | | — | 4 | — |
| 5 | 1 | C2 | 1 | S |
| 6 | 2 | C6 | 2 | S |
| 7 | 3 | C10 | 3 | S |
| 8 | | — | 4 | — |
| 9 | 1 | C3 | 1 | S |
| 10 | 2 | C7 | 2 | S |
| 11 | 3 | C11 | 3 | S |
| 12 | | — | 4 | — |
| 13 | 1 | C4 | 1 | S |
| 14 | 2 | C8 | 2 | S |
| 15 | 3 | C12 | 3 | S |
| 16 | | — | 4 | — |
| 17 | 1 | SOP1 | 1 | M |
| 18 | | — | 2 | — |
| 19 | | — | 3 | — |
| 20 | | — | 4 | — |
| 21 | 2 | SOP2 | 1 | M |
| 22 | | — | 2 | — |
| 23 | | — | 3 | — |
| 24 | | — | 4 | — |
| 25 | 3 | SOP3 | 1 | M |
| 26 | | — | 2 | — |
| 27 | | — | 3 | — |
| 28 | | — | 4 | — |
| 29 | 1 | QFP1 | 1 | L |
| 30 | | — | 2 | — |
| 31 | | — | 3 | — |
| 32 | | — | 4 | — |
| 33 | 2 | QFP2 | 1 | L |
| 34 | | — | 2 | — |
| 35 | | — | 3 | — |
| 36 | | — | 4 | — |
| 37 | 3 | QFP3 | 1 | L |
| 38 | | — | 2 | — |
| 39 | | — | 3 | — |
| 40 | | — | 4 | — |

Fig.10

REVERSAL METHOD

| | SUB-BOARD | COMPONENT | PLACEMENT HEAD NO. | SUCTION NOZZLE |
|---|---|---|---|---|
| 1 | 1 | C1 | 1 | S |
| 2 | 1 | C2 | 2 | S |
| 3 | 1 | C3 | 3 | S |
| 4 | 1 | C4 | 4 | S |
| 5 | 1 | SOP1 | 1 | M |
| 6 | | — | 2 | — |
| 7 | | — | 3 | — |
| 8 | | — | 4 | — |
| 9 | 1 | QFP1 | 1 | L |
| 10 | | — | 2 | — |
| 11 | | — | 3 | — |
| 12 | | — | 4 | — |
| 13 | 1 | QFP2 | 1 | L |
| 14 | | — | 2 | — |
| 15 | | — | 3 | — |
| 16 | | — | 4 | — |
| 17 | 2 | SOP2 | 1 | M |
| 18 | | — | 2 | — |
| 19 | | — | 3 | — |
| 20 | | — | 4 | — |
| 21 | 2 | C5 | 1 | S |
| 22 | 2 | C6 | 2 | S |
| 23 | 2 | C7 | 3 | S |
| 24 | 2 | C8 | 4 | S |
| 25 | 3 | C9 | 1 | S |
| 26 | 3 | C10 | 2 | S |
| 27 | 3 | C11 | 3 | S |
| 28 | 3 | C12 | 4 | S |
| 29 | 3 | SOP3 | 1 | M |
| 30 | | — | 2 | — |
| 31 | | — | 3 | — |
| 32 | | — | 4 | — |
| 33 | 3 | QFP3 | 1 | L |
| 34 | | — | 2 | — |
| 35 | | — | 3 | — |
| 36 | | — | 4 | — |

Fig.15

| STEP No. | COMPONENT | FEED X | FEED Y | PLACEMENT X | PLACEMENT Y | PLACEMENT HEAD NO. |
|---|---|---|---|---|---|---|
| 1 | C1 | $K_1$ | 0 | $X_{11}$ | $Y_1$ | 39d |
| 2 | C2 | $K_2$ | 0 | $X_{12}$ | $Y_1$ | 39c |
| 3 | C3 | $K_3$ | 0 | $X_{13}$ | $Y_1$ | 39b |
| 4 | C4 | $K_4$ | 0 | $X_{14}$ | $Y_1$ | 39a |
| 5 | C5 | $K_5$ | 0 | $X_{11}$ | $Y_2$ | 39d |
| 6 | C6 | $K_6$ | 0 | $X_{12}$ | $Y_2$ | 39c |
| 7 | C7 | $K_7$ | 0 | $X_{13}$ | $Y_2$ | 39b |
| 8 | C8 | $K_8$ | 0 | $X_{14}$ | $Y_2$ | 39a |

Fig.17

STEP REPEAT METHOD

| | SUB-BOARD | COMPONENT | PLACEMENT HEAD NO. | SUCTION NOZZLE |
|---|---|---|---|---|
| 1 | 1 | C1 | 1 | S |
| 2 | | — | 2 | — |
| 3 | | — | 3 | — |
| 4 | | — | 4 | — |
| 5 | 2 | C5 | 1 | S |
| 6 | | — | 2 | — |
| 7 | | — | 3 | — |
| 8 | | — | 4 | — |
| 9 | 3 | C9 | 1 | S |
| 10 | | — | 2 | — |
| 11 | | — | 3 | — |
| 12 | | — | 4 | — |
| 13 | 1 | C2 | 1 | S |
| 14 | | — | 2 | — |
| 15 | | — | 3 | — |
| 16 | | — | 4 | — |
| 17 | 2 | C6 | 1 | S |
| 18 | | — | 2 | — |
| 19 | | — | 3 | — |
| 20 | | — | 4 | — |
| 21 | 3 | C10 | 1 | S |
| 22 | | — | 2 | — |
| 23 | | — | 3 | — |
| 24 | | — | 4 | — |
| 45 | 3 | C12 | 1 | S |
| 46 | | — | 2 | — |
| 47 | | — | 3 | — |
| 48 | | — | 4 | — |
| 49 | 1 | SOP1 | 1 | M |
| 50 | | — | 2 | — |
| 51 | | — | 3 | — |
| 52 | | — | 4 | — |
| 53 | 2 | SOP2 | 1 | M |
| 54 | | — | 2 | — |
| 55 | | — | 3 | — |
| 56 | | — | 4 | — |
| 57 | | | | |

NOZZLE CHANGE

Fig.19

PATTERN REPEAT METHOD

| | SUB-BOARD | COMPONENT | PLACEMENT HEAD NO. | SUCTION NOZZLE |
|---|---|---|---|---|
| 1 | 1 | C1 | 1 | S |
| 2 | 1 | C2 | 2 | S |
| 3 | 1 | C3 | 3 | S |
| 4 | 1 | C4 | 4 | S |
| 5 | 1 | SOP1 | 1 | M |
| 6 | | — | 2 | — |
| 7 | | — | 3 | — |
| 8 | | — | 4 | — |
| 9 | 1 | QFP1 | 1 | L |
| 10 | | — | 2 | — |
| 11 | | — | 3 | — |
| 12 | | — | 4 | — |
| 13 | 2 | C5 | 1 | S |
| 14 | 2 | C6 | 2 | S |
| 15 | 2 | C7 | 3 | S |
| 16 | 2 | C8 | 4 | S |
| 17 | 2 | SOP2 | 1 | M |
| 18 | | — | 2 | — |
| 19 | | — | 3 | — |
| 20 | | — | 4 | — |
| 21 | 2 | QFP2 | 1 | L |
| 22 | | — | 2 | — |
| 23 | | — | 3 | — |
| 24 | | — | 4 | — |
| 25 | 3 | C9 | 1 | S |
| 26 | 3 | C10 | 2 | S |
| 27 | 3 | C11 | 3 | S |
| 28 | 3 | C12 | 4 | S |
| 29 | 3 | SOP3 | 1 | M |
| 30 | | — | 2 | — |
| 31 | | — | 3 | — |
| 32 | | — | 4 | — |
| 33 | 3 | QFP3 | 1 | L |
| 34 | | — | 2 | — |
| 35 | | — | 3 | — |
| 36 | | — | 4 | — |

COMPONENT MOUNTING METHOD AND COMPONENT MOUNTING APPARATUS

TECHNICAL FIELD

The present invention relates to a component mounting method and a component mounting apparatus for manufacturing circuit boards by placing a multiplicity of components onto a circuit board.

BACKGROUND ART

In recent years, needs for mounting apparatus for electronic components have been changing from rotary type high-speed mounters to robot type mounters that can flexibly be adapted to various forms of production, in terms of area productivity and component adaptability. Under such circumstances, for more improvement in productivity, those mounting apparatuses of which the number of placement heads to be mounted on one robot has evolved from one to many, and in which a suction nozzle to be used for each placement head is removable and interchangeable, have been forming a mainstream.

In this type of electronic component mounting apparatus, there are some cases to use a so-called multiple board which is prepared by providing a plurality of circuits having an identical pattern on one circuit board, mounting a plurality of electronic components onto this circuit board, and thereafter cutting the board according to individual circuit patterns so that a plurality of sub-boards, each having an identical circuit pattern, are fabricated. It is noted that such a multiple board herein refers to a multiple board composed of a plurality of sub-boards in this Specification.

The following methods are available as examples of prior art for placing electronic components onto such a multiple board composed of a plurality of sub-boards:

(1) A step repeat method including steps of performing a step of placing particular components (hereinafter, referred to as a placement step) onto all the sub-boards, and after completion of the placement step, moving to a next placement step; and (2) A pattern repeat method including steps of performing all placement steps for one sub-board, and after completion of all the placement steps, moving to a placement step for a next sub-board.

Both of these step repeat and pattern repeat methods have been widely used since preparing only an NC program as a mounting program for only one sub-board makes it possible to develop a program for all components to be mounted onto a circuit board by setting relative distances to other sub-boards.

A component mounting method for this multiple board is described below.

FIG. 7 shows a mounting procedure for a conventional step repeat method. FIG. 17 sequentially shows a placement procedure through component placement steps with an electronic component mounting apparatus having four placement heads (placement head Nos. 1–4) connected to one another.

In FIG. 17, the column "STEP NO." shows numbers sequentially assigned to steps of placement, where it is assumed that steps corresponding to a number of placement heads are involved in one-cycle operation from suction to placing of components by the four connected placement heads. The column "SUB-BOARD" shows, by numbers of sub-boards, on which sub-board on the circuit board a component is to be placed. The column "COMPONENT" shows components to be placed during respective steps. The column "PLACEMENT HEAD NO." shows placement heads to be used during individual steps. The column "SUCTION NOZZLE" shows which type of suction nozzle is used during individual steps. The type of suction nozzle to be used depends on a configuration and size of a component, where suction nozzles come in S (small), M (medium), and L (large) sizes. It is assumed here, as an example, that small-size components are sucked by the S-size suction nozzle, medium-size components are sucked by the M-size suction nozzle, and large-size components are sucked by the L-size suction nozzle. If there are some placement heads that do not suck any component during the one-cycle operation, the placement head actually does not suck and place any component, and so fields of component and suction nozzle are marked with "–" in FIG. 17.

As shown in FIG. 17, during this placement procedure, components of the same type are placed for individual patterns in an order of a chip component C1 of a first pattern to C5 of a second pattern to C9 of a third pattern, . . . , and upon completion of one placement step, a working step moves to a placement step for a next same type of chip components C2, C6, and C10. This placement step is performed for all components. It is noted that the suction nozzle is changed from S size for small-size components to M size for medium-size components after placement of chip component C12 of the third pattern, and changed from M size for medium-size components to L size for large-size components after placement of components SOP1–SOP3 (where "SOP" is an abbreviation of Small Outline Package).

Next, a conventional pattern repeat mounting method is described.

FIG. 18 shows a mounting procedure according to the conventional pattern repeat method. FIG. 19 shows this sequential placement procedure through electronic-component placement steps with an electronic component mounting apparatus having four placement heads (placement head Nos. 1–4).

In this placement procedure, as shown in FIG. 19, after all placement steps for a first pattern are completed in order of chip components C1–C4, SOP1, and QFP1 of the first pattern (where "QFP" is an abbreviation of Quad Flat Package), a working step moves to a placement step for a second pattern. Then, upon completion of placement for the second pattern, the working step moves to a placement step for a third pattern. It is noted that changing of suction nozzles is performed respectively after completion of placement of one kind of component for each pattern. In the case of FIG. 19, changing of suction nozzles is performed three times for each pattern, totaling eight times (a last time being unnecessary).

However, in a case of the step repeat method, since only one, from among the four suction nozzles, is used at all times, component suction and component placement are repetitively performed for every one component, causing mounting time to be prolonged. Thus, this mounting method does not take full advantage of a multiple-head construction having a plurality of suction nozzles, resulting in an inefficient mounting method.

On the other hand, in a case of the pattern repeat method, since changing of suction nozzles is frequently performed, mounting time would be prolonged each time time-consuming nozzle changing work is performed a plurality of times. Thus, this method results in an inefficient mounting method.

Applying such a mounting method to recently increasing large-scale multiple boards composed of, for example, 50–200 boards would cause a mounting apparatus to operate quite tediously. Since such an inefficient mounting method can hardly achieve any improvement in process time, there has been a keen desire for mounting methods of higher efficiency.

Moreover, during suction of electronic components to suction nozzles, even when the electronic components to be sucked are located at adjoining (succeeded) positions of component feeders as shown in FIGS. 20A–20D as an example, transfer heads need to be transferred one by one to perform component suction because an array interval P of component feeders differs from an array interval L of suction nozzles of the transfer heads. Besides, even if the array interval P of component feeders is equal to the array interval L of the suction nozzles, a shift of electronic components from an array line would make it not possible to achieve simultaneous suction. Furthermore, any difference in component thickness would also make simultaneous suction of electronic components no longer achievable.

Therefore, a component placement operation for suction nozzles cannot be performed by a one-time simultaneous vertical operation of the suction nozzles, thereby making it necessary to repetitively perform operations of moving a transfer head to its corresponding component feed position and sucking a component for every suction nozzle as shown in FIGS. 20A to 20D. As a result, it would take a longer time to cause electronic components to be held by the suction nozzles, which has been an obstacle to reduction in mounting time.

The present invention having been achieved in view of these and other issues, an object of the present invention is to provide a component mounting method and a component mounting apparatus which allows mounting time to be shortened by reducing such a suction preparation operation for suction nozzles as suppressing a changing frequency of the suction nozzles, or adjusting intervals of suction nozzles of a transfer head during a process of component mounting onto a multiple board.

SUMMARY OF THE INVENTION

In order to achieve the above object, the present invention has the following constitution.

According to a first aspect of the present invention, there is provided a component mounting method for placing components successively at component placing positions on a multiple board, composed of a plurality of sub-boards, by component holding devices equipped with a plurality of removable suction nozzles which is operable to hold the components, the method comprising:

during placing the components onto the board, applying a placement step for all the sub-boards, with the placement step being a step of placing onto the board all of components that are holdable by at least one identical suction nozzle out of the plurality of suction nozzles; and after completion of the placement step, changing the suction nozzle to another suction nozzle and moving to a next placement step, whereby component mounting for individual sub-boards is performed.

With this component mounting method, during placement of components onto a multiple board, the suction nozzle is changed after the placement step of placing onto the multiple board all the components that can be held by the same suction nozzle is applied to all sub-boards. Thus, a changing frequency of suction nozzles can be suppressed to a minimum, so that component mounting time can greatly be shortened.

According to a second aspect of the present invention, there is provided a component mounting method for placing components successively at component placing positions on a multiple board, composed of a plurality of sub-boards, by component holding devices equipped with a plurality of removable suction nozzles which is operable to hold the components, the method comprising:

during placing the components onto the board, applying a placement step to all the sub-boards, with the placement step being a step of, with components of an identical type held on the suction nozzles, respectively, placing these held components onto the sub-boards, respectively, successively; and after completion of the placement step, moving to a next placement step, whereby component mounting for individual sub-boards is performed.

With this component mounting method, during placement of components onto a multiple board, components of the same type are held by the suction nozzles, respectively, and a working step moves to a next step after the placement step of continuously placing the components onto the individual sub-boards is applied to all the sub-boards. Thus, an operation of repeating suction and placement for every one component by the conventional pattern repeat method is replaced by an operation of sucking components at one time and then placing these components onto the board, thereby allowing component mounting time to be shortened.

According to a third aspect of the present invention, there is provided a component mounting method for placing components successively at component placing positions on a multiple board, composed of a plurality of sub-boards, by component holding devices equipped with a plurality of removable suction nozzles which is operable to hold the components, the method comprising:

after completion of component mounting for one sub-board, and in performing component mounting for a next sub-board in placing the components onto the board, using suction nozzles that are last used for the one sub-board, as they are, for the next sub-board, whereby component mounting for individual sub-boards is performed.

With this component mounting method, during placing of components onto a multiple board, when placement of components for one sub-board is completed, and thereafter subsequently placement of components for a next sub-board is performed, a suction nozzle last used for the one sub-board for which placement has been completed is used for the next sub-board, as it is. Thus, changing of suction nozzles for the sub-boards can be saved one time, so that component mounting time can be shortened.

According to a fourth aspect of the present invention, there is provided a component mounting apparatus for mounting components onto a multiple board by using the component mounting method as defined in any one of the first to third aspects.

With this component mounting apparatus, during placement of components onto a multiple board, since a mounting operation is performed efficiently so as not to be wasteful, a reduction in component mounting time can be achieved.

According to a fifth aspect of the present invention, there is provided a component mounting method including: moving a transfer head, on which a plurality of component holding devices operable to hold components are mounted, to component feed sections with a plurality of components arrayed on the component feed sections; causing the components to be held by the component holding devices after being received from the component feed sections; and lowering the component holding devices over component placing positions of a circuit board, thereby placing the components held by the component holding devices onto the circuit board, wherein array intervals of the component holding devices of the transfer head are coincident with at least one of component array intervals of the component feed sections and intervals of the component placing positions on the circuit board.

During this component mounting method, which is a component mounting method including steps of laterally moving the transfer head that are to hold components, causing the components received from the component feed section to be held by the component holding devices, and then mounting the components at component placing positions on the circuit board, components can be held by the component holding devices by moving the component holding devices vertically one time simultaneously at a time of removing the components from the component feed sections by virtue of coincidence between the component array interval of the component feed sections or the interval of the component placing positions on the circuit board and the array interval of the component holding devices of the transfer head. Besides, during placing the components held by the component holding devices onto the circuit board, the components can be placed at desired positions on the circuit board by moving the component holding devices vertically one time simultaneously. As a result, component mounting time can be greatly shortened.

According to a sixth aspect of the present invention, there is provided a component mounting apparatus comprising:

a transfer-head moving device for laterally movably supporting a transfer head operable to hold components and place the components onto a board, with the transfer-head moving device being provided above the board onto which the components are to be mounted;

a plurality of juxtaposed component holding devices provided on the transfer head and operable to hold the components;

a plurality of juxtaposed component feed sections having a plurality of components accommodated therein and operable to feed the components to the component holding devices; and a component-holding-device moving mechanism disposed on the transfer head and operable to adjust array intervals of the plurality of component holding devices.

With this component mounting apparatus, in which the transfer head is equipped with a component-holding-device moving mechanism for adjusting an array interval of a plurality of component holding devices, the array interval of the component holding devices of the transfer head can be adjusted so as to be coincident with a component array interval in the component feed sections or an interval of the component placing positions on the board. Thus, components can be held by the component holding devices by moving the component holding devices vertically one time simultaneously at a time of removing the components from the component feed sections. Besides, the components can be placed at desired positions on the board by moving the component holding devices vertically one time simultaneously at a time of placing the components held by the component holding devices onto the board. Thus, component mounting time can be greatly shortened.

According to a seventh aspect of the present invention, there is provided a component mounting apparatus comprising:

a transfer-head moving device for laterally movably supporting a transfer head operable to hold components and place the components onto a board, with the transfer-head moving device being provided above the board onto which the components are to be mounted;

a plurality of juxtaposed component holding devices provided on the transfer head and operable to hold the components; and a plurality of juxtaposed and arrayed component feed sections having a plurality of components accommodated therein and operable to feed the components to the component holding devices, wherein array intervals of the plurality of component holding devices of the transfer head are coincident with array intervals of the component feed sections.

With this component mounting apparatus, components can be held by the component holding devices by moving the component holding devices vertically one time simultaneously at a time of removing the components from the component feed sections by virtue of coincidence between the array intervals of the component holding devices of the transfer head and the array intervals of the component feed sections. Thus, component mounting time can be greatly shortened.

According to an eighth aspect of the present invention, there is provided a component mounting apparatus comprising:

a transfer-head moving device for laterally movably supporting a transfer head operable to hold components and place the components onto a board, with the transfer-head moving device being provided above the board onto which the components are to be mounted;

a plurality of juxtaposed component holding devices provided on the transfer head and operable to hold the components; and a plurality of juxtaposed component feed sections having a plurality of components accommodated therein and operable to feed the components to the component holding devices, wherein array intervals of the plurality of component holding devices of the transfer head are coincident with intervals of component placing positions on the board where the components held by the component holding devices are to be placed.

With this component mounting apparatus, during placing components held by the component holding devices onto a circuit board, the components can be placed at desired positions on the board by moving the component holding devices vertically one time simultaneously by virtue of coincidence between the array intervals of the component holding devices of the transfer head and the intervals of the component placing positions on the board for the components held by the component holding devices. Thus, component mounting time can be greatly shortened.

According to a ninth aspect of the present invention, there is provided a component mounting apparatus according to the sixth aspect, wherein the component-holding-device moving mechanism can adjust array intervals of the plurality of component holding devices of the transfer head so that the array intervals of the plurality of component holding devices become coincident with component array intervals of the component feed sections.

According to a tenth aspect of the present invention, there is provided a component mounting apparatus according to the sixth aspect, wherein the component-holding-device moving mechanism can adjust array intervals of the plurality of component holding devices of the transfer head so that the array intervals of the plurality of component holding devices become coincident with array intervals of the component feed sections.

According to an eleventh aspect of the present invention, there is provided a component mounting method including: moving a transfer head on which a plurality of component holding devices operable to hold components are mounted; causing components to be held by the component holding devices after being received from a component feed section with a plurality of components arrayed thereon; and thereafter lowering the component holding devices over component placing positions of a circuit board, thereby placing the components held by the component holding devices onto the circuit board, the method comprising:

before performing either one of an operation of holding the plurality of components by the plurality of component holding devices of the transfer head and an operation of placing the plurality of components onto the circuit board, moving the component holding devices to adjust intervals between adjacent component holding devices of the transfer head so that the intervals between adjacent component holding devices become coincident with array intervals of a plurality of components targeted for this either one operation; and thereafter performing the either one operation by utilizing the plurality of component holding devices of the transfer head.

According to a twelfth aspect of the present invention, there is provided a component mounting method according to the eleventh aspect, wherein the either one operation is the operation of holding the plurality of components by the component holding devices, and the array intervals of the plurality of components targeted for the either one operation are array positional intervals of component array of the component feed section.

According to a thirteenth aspect of the present invention, there is provided a component mounting method according to the eleventh aspect, wherein the either one operation is the operation of placing the plurality of components onto the circuit board, and the array intervals of the plurality of components targeted for the either one operation are array positional intervals of component placing positions on the circuit board.

According to a fourteenth aspect of the present invention, there is provided a component mounting method according to any one of the eleventh to thirteenth aspects, further comprising:

before adjusting intervals between adjacent component holding devices, obtaining array positional information as to the plurality of components targeted for the either one operation and, based on this obtained array positional information as to the plurality of components targeted for the either one operation, determining intervals between adjacent component holding devices of the transfer head; and thereafter moving the component holding devices to adjust the intervals between the adjacent component holding devices so that the intervals between the adjacent component holding devices become these determined intervals between the adjacent component holding devices of the transfer head.

According to a fifteenth aspect of the present invention, there is provided a component mounting method according to any one of the eleventh to fourteenth aspects, wherein adjustment of the array intervals of the component holding devices of the transfer head is performed during movement of the transfer head.

According to a sixteenth aspect of the present invention, there is provided a component mounting method according to the fourteenth aspect, wherein obtaining the array positional information as to the plurality of components is performed by reading array positional information of the plurality of components previously stored in a storage device.

According to a seventeenth aspect of the present invention, there is provided a component mounting method according to the fourteenth aspect, wherein obtaining the array positional information as to the plurality of components is performed by obtaining array positional information as to the plurality of components recognized by a component-array-positional-information recognition device of the transfer head.

According to an eighteenth aspect of the present invention, there is provided a component mounting apparatus which operates through: moving a transfer head on which a plurality of component holding devices operable to hold components are mounted; causing components to be held by the component holding devices after being received from a component feed section with a plurality of components arrayed thereon; and thereafter lowering the component holding devices over component placing positions of a circuit board, thereby mounting the components held by the component holding devices onto the circuit board, the apparatus comprising:

a component-holding-device moving mechanism provided on the transfer head and operable to move the component holding devices so as to adjust array intervals of the plurality of component holding devices;

a control section which can perform control for, before performing either one of an operation of holding the plurality of components by the plurality of component holding devices of the transfer head and an operation of placing the plurality of components onto the circuit board, driving the component-holding-device moving mechanism to move the component holding devices so as to adjust intervals between adjacent component holding devices of the transfer head so that the intervals between adjacent component holding devices become coincident with array intervals of a plurality of components targeted for this either one operation, and thereafter performing the either one operation by utilizing the plurality of component holding devices of the transfer head.

According to a nineteenth aspect of the present invention, there is provided a component mounting apparatus according to the eighteenth aspect, wherein the either one operation is the operation of holding the plurality of components by the component holding devices, and the array intervals of the plurality of components targeted for the either one operation are array positional intervals of component array of the component feed section.

According to a twentieth aspect of the present invention, there is provided a component mounting apparatus according to the eighteenth aspect, wherein the either one operation is the operation of placing the plurality of components onto the circuit board, and the array intervals of the plurality of components targeted for the either one operation are array positional intervals of component placing positions on the circuit board.

According to a twenty-first aspect of the present invention, there is provided a component mounting apparatus according to any one of the eighteenth to twentieth aspects, further comprising: an arithmetic section for, before adjusting intervals between adjacent component holding devices, determining array intervals of the plurality of components targeted for the either one operation based on array positional information as to the plurality of components, > wherein the control section can perform control for driving the component-holding-device moving mechanism to move the component holding devices so as to adjust intervals between adjacent component holding devices so that the intervals between adjacent component holding devices of the transfer head become coincident with array intervals of the plurality of components targeted for the either one operation as determined by the arithmetic section, and thereafter performing the either one operation by utilizing the plurality of component holding devices of the transfer head.

According to a twenty-second aspect of the present invention, there is provided a component mounting apparatus according to any one of the eighteenth to twenty-first aspects, wherein the control section is operable to adjust the array intervals of the plurality of component holding devices of the transfer head by driving the component-holding-device moving mechanism during movement of the transfer head.

According to a twenty-third aspect of the present invention, there is provided a component mounting apparatus according to the twenty-first aspect, further comprising: a storage device for previously storing array positional information, > wherein the arithmetic section is operable to determine the array intervals of the plurality of components based on array positional information as to the plurality of components as read from the storage device.

According to a twenty-fourth aspect of the present invention, there is provided a component mounting apparatus according to the twenty-first aspect, further comprising: a component-array-positional-information recognition device disposed on the transfer head and operable for recognizing component array positional information, > wherein the arithmetic section is operable to determine intervals between adjacent component holding devices of the transfer head based on the component array positional information as to component placing positions on the circuit board as recognized by the component-array-positional-information recognition device.

According to a twenty-fifth aspect of the present invention, there is provided a component mounting method according to the twelfth aspect, wherein there are a plurality of component feed sections, and wherein the either one operation is the operation of holding the plurality of components by the component holding devices, and the array intervals of the plurality of components targeted for the either one operation are array positional intervals of component array of the component feed sections, > the method further comprising: instead of moving the component holding devices so that the intervals between adjacent component holding devices of the transfer head become coincident with the array intervals of the plurality of components targeted for the either one operation, moving the plurality of component feed sections so that array intervals of the plurality of component feed sections become coincident with intervals between the adjacent component holding devices of the transfer head; and
>
> thereafter performing an operation of holding the plurality of components at the plurality of component feed sections by the plurality of component holding devices of the transfer head.

More specifically, in the twenty-fifth aspect, the present invention provides a component mounting method comprising: moving a transfer head on which a plurality of component holding devices for holding components thereon are mounted; causing components to be held by the component holding devices after being received from component feed sections on which a plurality of components are arrayed; and thereafter lowering the component holding devices at component placing positions on a circuit board, whereby the components held by the component holding devices are mounted onto the circuit board, the component mounting method further comprising:

> prior to the operation of holding the plurality of components by the plurality of component holding devices of the transfer head, moving the plurality of component feed sections so that array intervals between the plurality of component feed sections coincide with intervals between adjacent component holding devices, whereby an interval between the adjacent component feed sections is adjusted; and
>
> thereafter performing the component holding operation by utilizing the plurality of component holding devices of the transfer head.

According to a twenty-sixth aspect of the present invention, there is provided a component mounting apparatus according to the nineteenth aspect, wherein there are a plurality of component feed sections, and wherein the either one operation is the operation of holding the plurality of components by the component holding devices, and the array intervals of the plurality of components targeted for the either one operation are array positional intervals of component array of the component feed sections, > the apparatus further comprising: instead of the component-holding-device moving mechanism, a component-feed-section moving mechanism for moving the plurality of component feed sections so that array intervals of the plurality of component feed sections become coincident with the intervals between adjacent component holding devices of the transfer head, and
>
> wherein the control section is operable to perform control for, before performing the operation of holding the plurality of components by the plurality of component holding devices of the transfer head, driving the component-feed-section moving mechanism to move the component feed sections so as to adjust intervals between adjacent component feed sections so that the array intervals of the plurality of component feed sections become coincident with the intervals between the adjacent component holding devices of the transfer heads; and thereafter performing the operation of holding the plurality of components by utilizing the plurality of component holding devices of the transfer head.

More specifically, in the twenty-sixth aspect, the present invention provides a component mounting apparatus for: moving a transfer head on which a plurality of component holding devices for holding components thereon are mounted; causing components to be held by the component holding devices after being received from component feed sections on which a plurality of components are arrayed; and thereafter lowering the component holding devices at component placing positions on a circuit board, whereby the components held by the component holding devices are mounted onto the circuit board, the component mounting apparatus further comprising:

a component-feed section moving mechanism for moving the component-feed sections so as to adjust array intervals between the plurality of component feed sections; and a control section for controlling: prior to the operation of holding the plurality of components by the plurality of component holding devices of the transfer head, so as to drive the component-feed section moving mechanism to move the plurality of component feed sections so that array intervals between the plurality of component feed sections coincide with intervals between adjacent component holding devices, whereby an interval between the adjacent component feed sections is adjusted; and thereafter so as to have the component holding operation be performed by the plurality of component holding devices of the transfer head.

BRIEF DESCRIPTION OF DRAWINGS

These and other aspects and features of the present invention will become clear from the following description taken in conjunction with the preferred embodiments thereof with reference to the accompanying drawings, in which:

FIG. 5 is a view sequentially showing placement steps of the task repeat method;

FIG. 8 is a view sequentially showing placement steps of the improved step repeat method;

FIG. 10 is a view sequentially showing placement steps of the reversal method;

FIG. 15 is an explanatory view showing an example of NC programs;

FIG. 17 is a view sequentially showing placement steps of a conventional step repeat method;

FIG. 19 is a view sequentially showing placement steps of the conventional pattern repeat method;

DETAILED DESCRIPTION OF THE PREFERRED EMBODIMENTS

Figure 1:
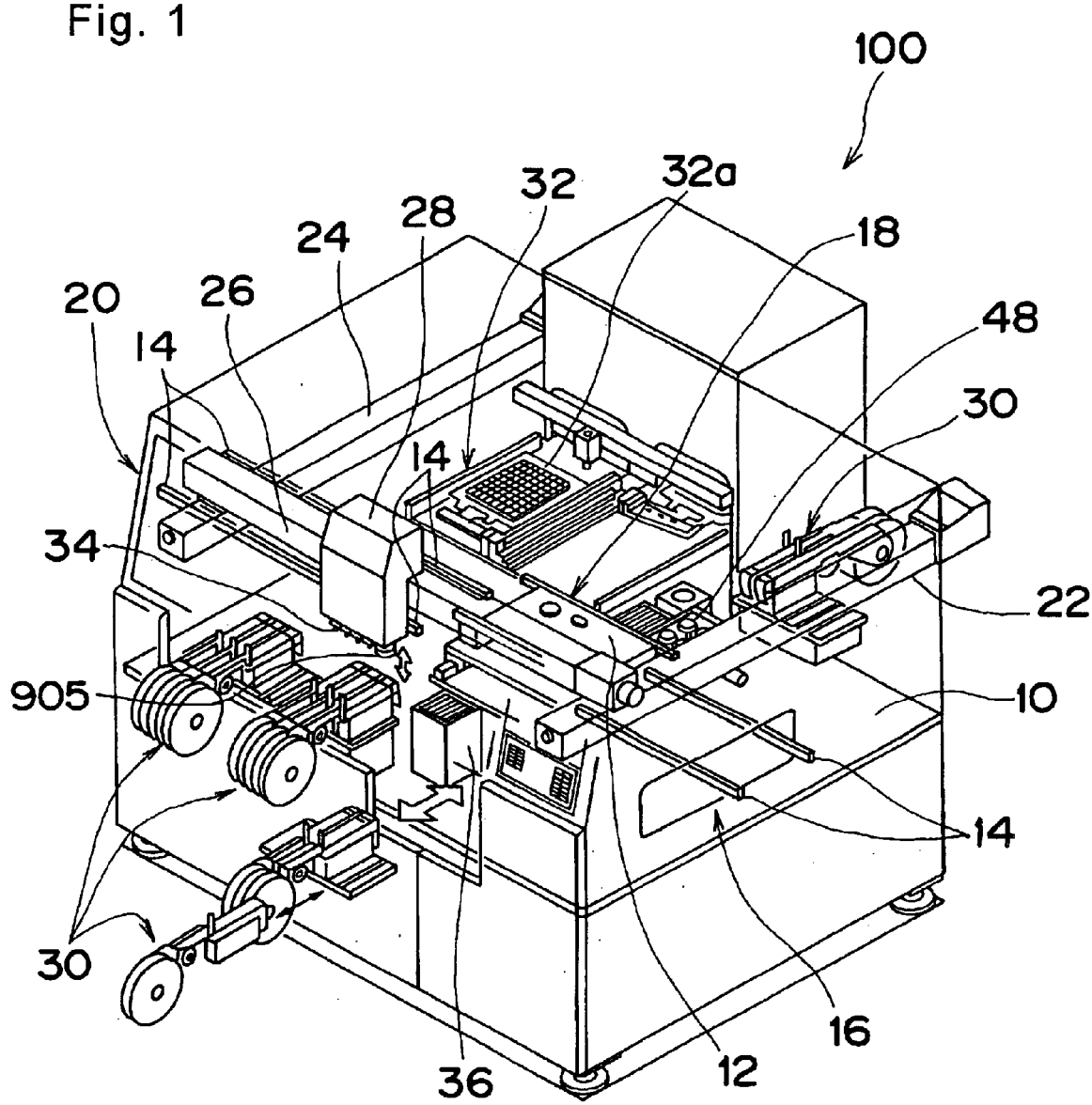
FIG. 1 is a perspective view of a component mounting apparatus as a first embodiment of the present invention.

Before description of the present invention proceeds, it is to be noted that like parts are designated by like reference numerals throughout the accompanying drawings.

Hereinbelow, preferred embodiments of the present invention are described in detail with reference to the drawings.

(First Embodiment)

Figure 2:
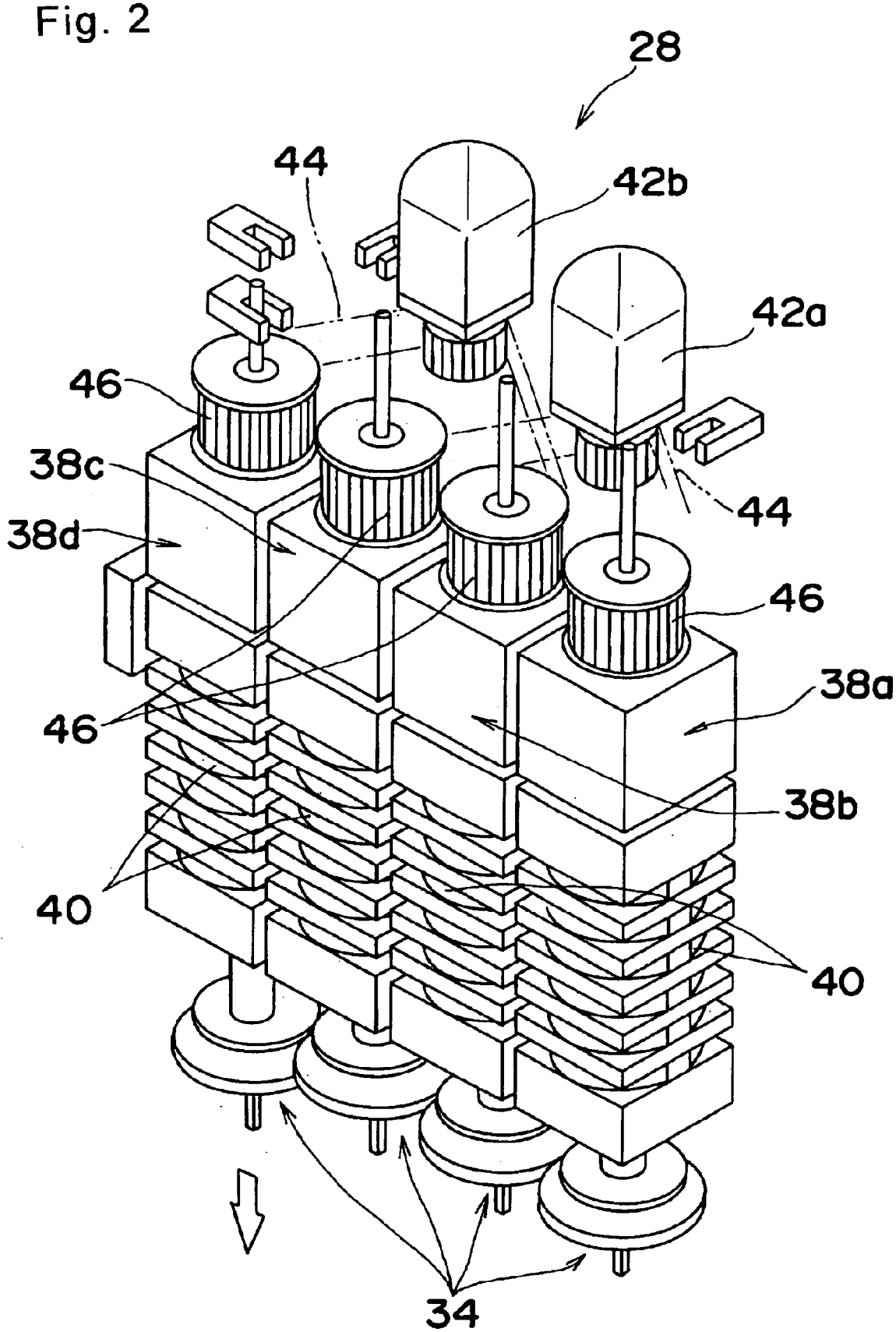
FIG. 2 is an enlarged perspective view of a transfer head of the component mounting apparatus.
Figure 3:
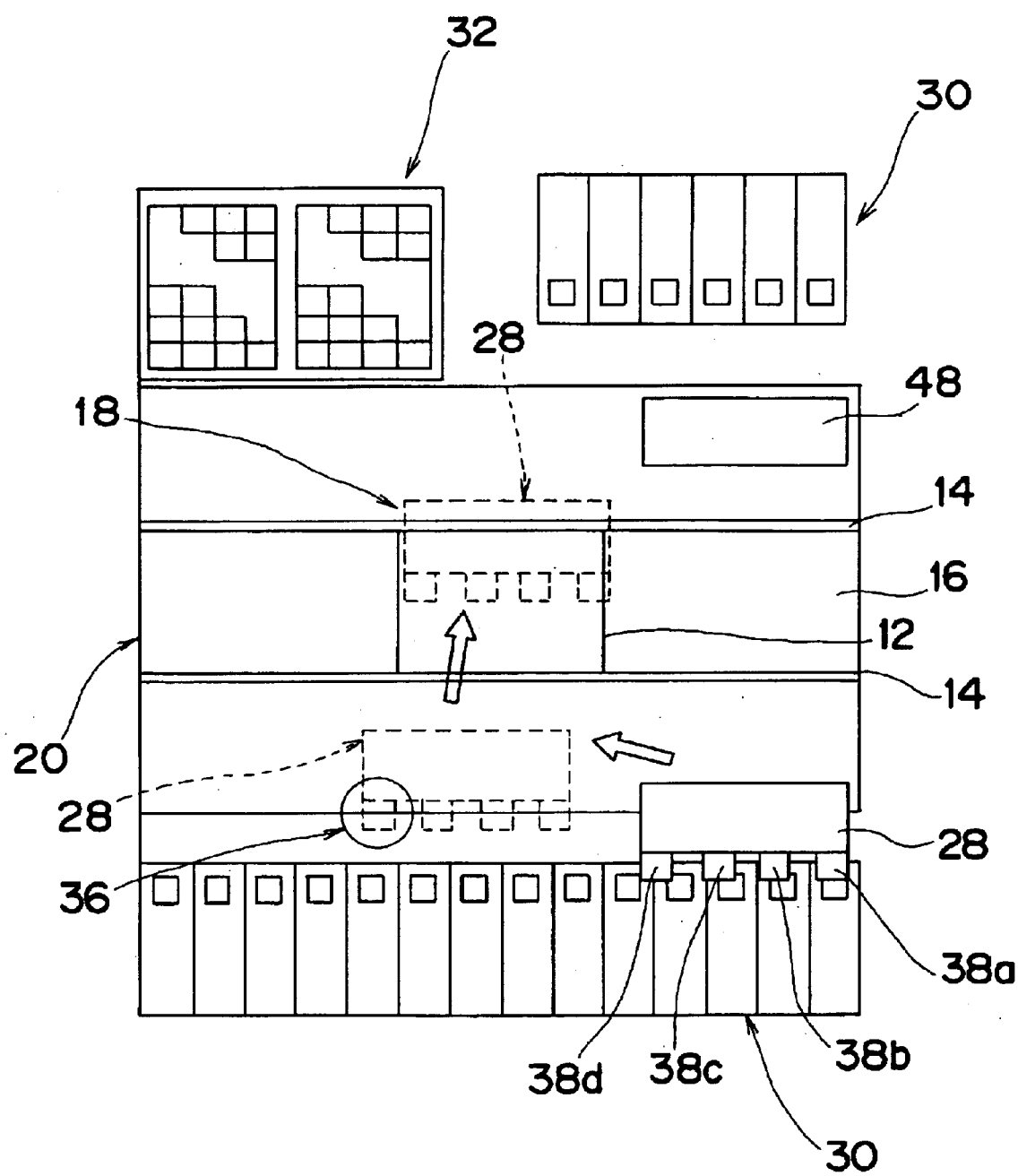
FIG. 3 is a schematic plan view of the component mounting apparatus.

FIG. 1 is a perspective view of an electronic component mounting apparatus which is an example of the component mounting apparatus as a first embodiment of the present invention, FIG. 2 is an enlarged perspective view of a transfer head of the electronic component mounting apparatus of FIG. 1, and FIG. 3 is a schematic plan view of the electronic component mounting apparatus.

First, construction of an electronic component mounting apparatus 100 of the first embodiment is described.

As shown in FIG. 1, a pair of guide rails 14 for a circuit board 12 are provided at each of a loader section 16, a board holding section 18, and an unloader section 20 in a top center of a base 10 of the electronic component mounting apparatus 100. By synchronously driving transfer belts provided for each one of these pairs of guide rails 14, respectively, the circuit board 12 is transferred from the pair of guide rails 14 of the loader section 16 on one end side to the pair of guide rails 14 of the board holding section 18 located at a position where components, e.g., electronic components are mounted, and further from the pair of guide rails 14 of the board holding section 18 to the pair of guide rails 14 of the unloader section 20 on another side. The board holding section 18 positions and holds a transferred circuit board 12, preparing for component mounting.

Y-axis robots 22, 24 are provided at both side portions, respectively, of a top surface of the base 10 upward of the circuit board 12, and an X-axis robot 26 is suspended between these two Y-axis robots 22, 24, where the X-axis robot 26 is advanceable and retreatable in a Y-axis direction by drive of the Y-axis robots 22, 24. Also, a transfer head 28 is attached to the X-axis robot 26 so as to be advanceable and retreatable in an X-axis direction, which arrangement makes the transfer head 28 movable within an X-Y plane. In each of the robots, for example, ball screws are rotated forwardly and reversely by motors, and nut members screwed with the ball screws are advanceable and retreatable in their respective axial directions, where members to be advanced and retreated are fixed to the nut members.

The transfer head 28, which is mounted on the X-Y robot (one example of a transfer-head moving device) composed of the X-axis robot 26 and the Y-axis robots 22, 24, and which freely moves in the X-Y plane (e.g., a horizontal plane or a plane generally parallel to the top surface of the base 10), is so constructed that desired electronic components are sucked by suction nozzles 34 from a plurality of component feeders 30 as an example of a component feed section for feeding such electronic components as resistor chips or chip capacitors, or from a component tray 32 as another example of a component feed section for feeding such relatively large-size electronic components as ICs such as SOPs or QFPs or connectors, and that sucked electronic components can be placed at component placing positions on the circuit board 12. Such an electronic-component mounting operation is controlled by a control section 52 of FIG. 21 according to a mounting program stored and preset in a storage section 1001.

These component feeders 30 and component tray 32 correspond to an example of component feed sections, where an array interval of components in the component feed sections refers to a distance between component feed ports of adjoining component feeders 30 in the case of the component feeders 30, or to a distance between accommodation recessed portions for accommodating the components in the component tray 32 in the case of the component tray 32.

The component feeders 30 are arrayed in a multiplicity on both sides (upper right side and lower left side in FIG. 1) in a transfer direction of the pair of guide rails 14. In each of the component feeders 30 are attached taped component rolls on which a multiplicity of electronic components such as resistor chips or chip capacitors are accommodated.

The component tray 32 can totally accommodate two trays 32a which are arranged longitudinally along a direction perpendicular to the board transfer direction of the pair of guide rails 14. Each tray 32a slides toward the pair of guide rails 14 according to a number of fed components so that a component takeout position in the Y direction is maintained at a constant position. On these trays 32a are placed a multiplicity of QFPs or other electronic components.

At a side portion of the circuit board 12 positioned near the pair of guide rails 14 is a recognition device 36 for detecting any two-dimensional positional shift (suction posture) of electronic components sucked by the suction nozzles 34, and allowing a correction of the transfer head 28 side so that this positional shift is canceled.

The transfer head 28, as shown in FIG. 2, is provided as a multiple head in which a plurality (four in the first embodiment) of placement heads (first placement head 38a, second placement head 38b, third placement head 38c, fourth placement head 38d) as an example of component holding devices are laterally connected together. The four placement heads 38a, 38b, 38c, 38d are of the same construction, with each placement head having a suction nozzle 34, an actuator 40 for driving the suction nozzle 34 into vertical (up-and-down) operation, and a pulley 46. Forward-and-reverse rotational driving force of a θ-rotation motor 42a is transmitted to the pulley 46 of the first placement head 38a and the pulley 46 of the third placement head 38c by a timing belt 44, so that the suction nozzles 34 of both these placement heads are put into θ-rotation (rotation around an axis of the suction nozzles 34) simultaneously. Also, forward-and-reverse rotation driving force of a θ-rotation motor 42b is transmitted to the pulley 46 of the second placement head 38b and the pulley 46 of the fourth placement head 38d by a timing belt 44, so that the suction nozzles 34 of both these placement heads are put into θ-rotation simultaneously. Each actuator 40 is constructed of, for example, an air cylinder, and turning on and off the air cylinder to move the suction nozzle 34 vertically, or up and down, makes it possible to perform component holding or a component mounting operation selectively. It has been arranged here that power of the θ-rotation motor 42a is transmitted by the timing belt 44, by which the suction nozzles 34 of the placement heads 38a, 38c are put into θ-rotation, respectively, while power of the θ-rotation motor 42b is transmitted by the timing belt 44, by which the suction nozzles of the placement heads 38b, 38d are put into θ-rotation, as shown in FIG. 2. However, such an arrangement is only an example, and it may be arranged that the first placement heads 38a, 38b, 38c, 38d are equipped with θ-rotation driving motors, respectively, that drive these placement heads into θ-rotation individually. However, it is preferable that the number of θ-rotation driving motors that serve for drive into θ-rotation be smaller to reduce weight of the transfer head 28.

The suction nozzles 34 of the placement heads are replaceable, and auxiliary suction nozzles for replacement are previously stored in a nozzle stocker 48 on the base 10 of the electronic component mounting apparatus 100. The suction nozzles 34 are provided in, for example, S-size nozzles for sucking very small chip components of about 1.0×0.5 mm, M-size nozzles for sucking 18 mm square QFPs, and the like, and put into use according to the type of electronic components to be placed.

Operation of the electronic component mounting apparatus having the above constitution is described below.

As shown in FIG. 3, when the circuit board 12 carried in from the loader section 16 of the pair of guide rails 14 is transferred to the board holding section 18, the transfer head 28 is moved laterally, i.e., within the X-Y plane by the X-Y robot to suck up desired electronic components from the component feeders 30 or the component tray 32, then moves to over a posture recognition camera of the recognition device 36 which recognizes a suction posture of the electronic components. Then, based on a recognition result, a corresponding θ-rotation motor is driven to put corresponding suction nozzles 34 into θ-rotation, thereby performing a correction operation for suction posture. Thereafter, the electronic components are placed at component placing positions on the circuit board 12.

During suction of electronic components from the component feeders 30 or the component tray 32 by the suction nozzles 34, as well as during placement of electronic components at the component placing positions on the circuit board 12, the placement heads 38a, 38b, 38c, 38d cause the suction nozzles 34 to move down, by actuation of the actuators 40, from in the X-Y plane in a vertical direction (Z-direction). Also, a placement operation is performed with the suction nozzles 34 replaced, as required, according to the type of the electronic components to be mounted.

By repeating the above operation of sucking electronic components and placing them onto the circuit board 12, mounting of electronic components onto the circuit board 12 is completed. The circuit board 12, after this mounting, is carried out from the board holding section 18 to the unloader section 20, while a new circuit board is carried in from loader section 16 to the board holding section 18 and the above operation is repeated.

It is noted here that mounting operations for electronic components are classified in terms of speed of mounting cycle time, such as high, medium, and low speeds, according to the type (size and weight) of electronic components. This is due to inertia of electronic components, where classification is determined depending on a suction force of the suction nozzles 34 and adhesion of the electronic components to a circuit board. Also, component suction is performed simultaneously by a plurality of placement heads, or component suction is performed with one placement head at a time.

Next, examples of an electronic component mounting method for multiple boards with use of the electronic component mounting apparatus according to the first embodiment of the present invention are described with reference to FIGS. 4 to 10.

EXAMPLE 1

First, a mounting operation performed by a task repeat method is described as Example 1. The task repeat method refers to a method of repeating a number of times, corresponding to patterns, a task of sucking components with a plurality of placement heads simultaneously, or individually, and then after recognition, placing all the components held on the placement heads onto the circuit board 12 simultaneously or individually.

Figure 4:
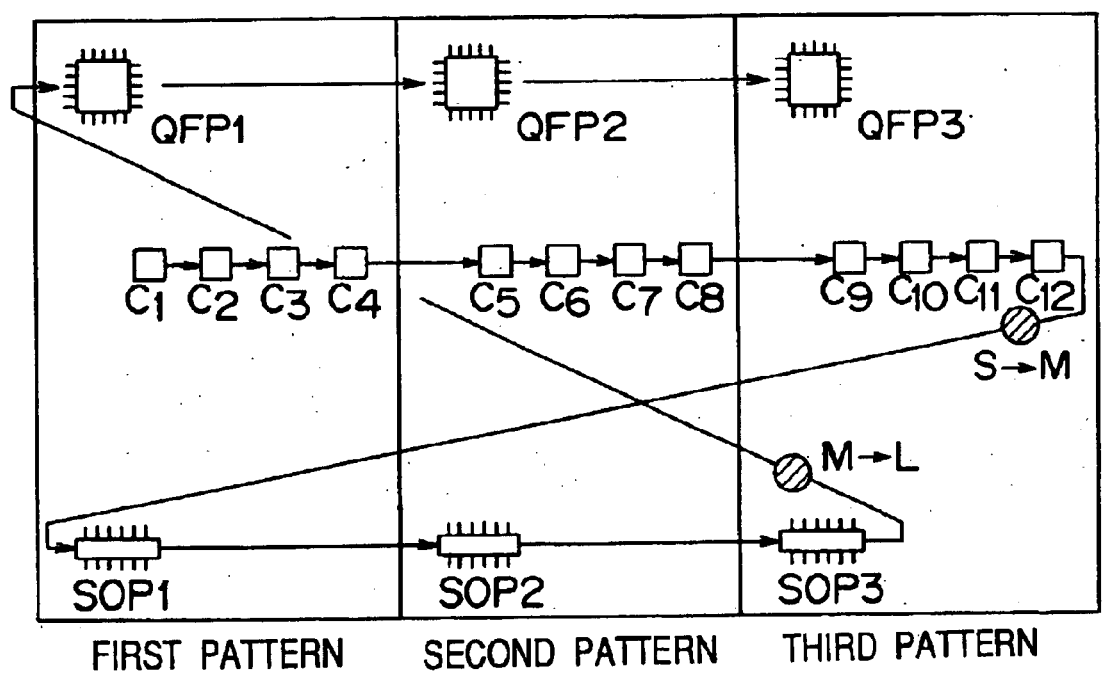
FIG. 4 is a view showing an order of placement by a task repeat method in an example of a multiple board composed of three sub-boards having an identical pattern.

FIG. 4 shows an example of a multiple board composed of three sub-boards of an identical pattern for explanation's sake, where it is assumed that chip components C1–C12, SOP1–SOP3, and QFP1–QFP3 are to be placed onto the pattern (first, second and third patterns) of each sub-board of this multiple board.

According to this mounting method, mounting of the electronic components is performed in an order of chip components to SOPs to QFPs as shown by arrows in FIG. 4. More specifically, as placement steps are shown sequentially in FIG. 5, first steps include sucking chip component C1 to the first placement head 38a, chip component C2 to the second placement head 38b, chip component C3 to the third placement head 38c, and chip component C4 to the fourth placement head 38d by S-size suction nozzles, moving the transfer head 28 to component placing positions, for these individual chip components, on the sub-board of the first pattern, and placing the chip components C1–C4 onto this sub-board in this order. Steps following this include sucking chip components C5–C8 by the placement heads 38a–38d, respectively, moving and placing these components at component placing positions on the sub-board of the second pattern, and likewise, further sucking chip components C9–C12 to the placement heads 38a–38d and placing these components at component placing positions on the sub-board of the third pattern in a similar way.

Next, for example, with the suction nozzle of the first placement head 38a changed from S to M size (where the placement head may be any other one), SOP1 is sucked by the first placement head 38a and placed at a component placing position on the sub-board of the first pattern. Next, SOP2 and SOP3 are sucked successively by the first placement head and placed at component placing positions on each other sub-board in a similar manner.

Then, with the suction nozzle 34 of the first placement head 38a changed from M to L size, QFPs 1–3 are placed at component placing positions on each sub-board.

With this task repeat method, during placing of electronic components onto three sub-boards, suction nozzles are changed only upon transitions from C12 to SOP1 and from SOP3 to QFP1. This minimizes a number of changes of suction nozzles, thereby allowing electronic components to be placed onto boards at high efficiency. Thus, a reduction in electronic-component mounting time can be achieved.

Figure 6:
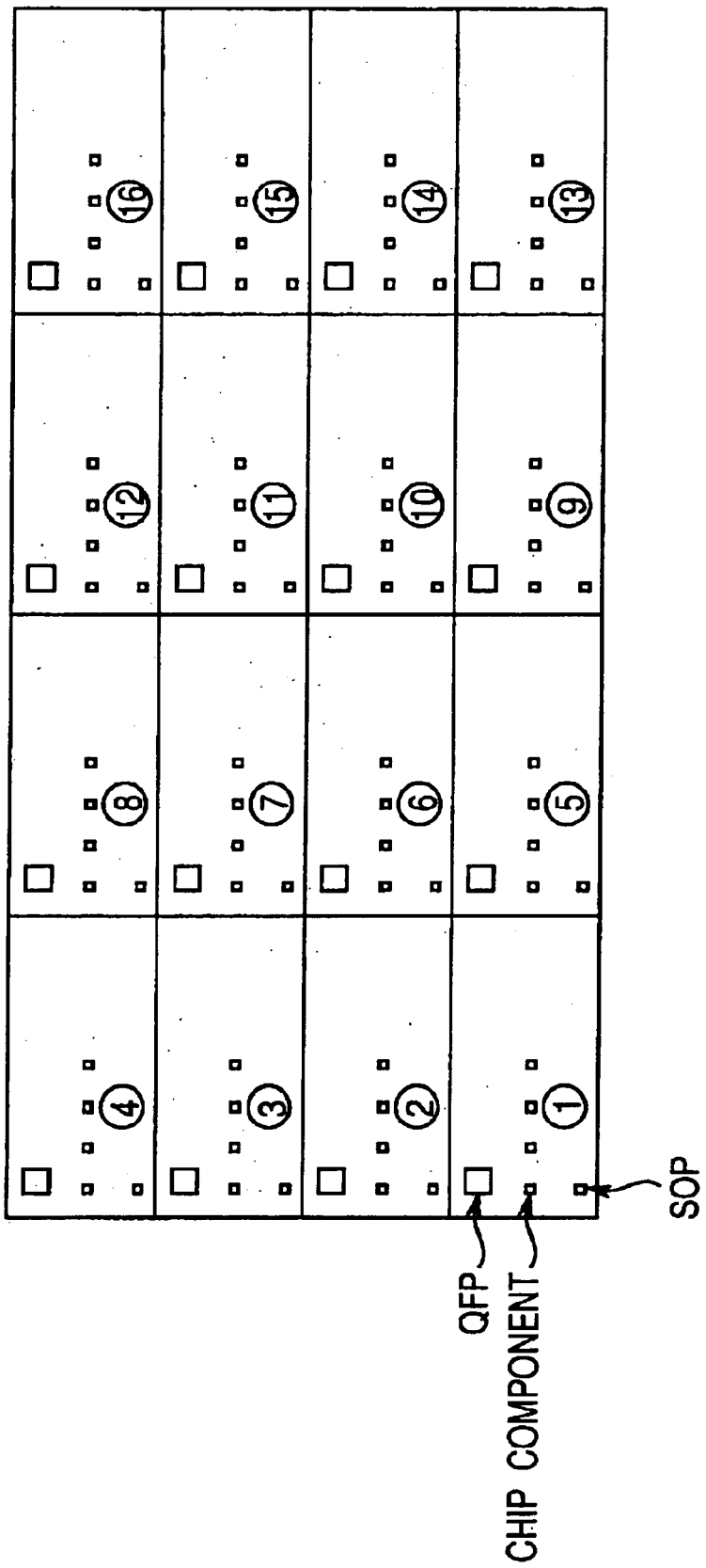
FIG. 6 is a view showing a multiple board having 16 sub-boards, longitudinally 4×laterally 4.

With this task repeat method, a mounting time for placing electronic components onto a multiple board having, for example, longitudinally 4×laterally 4, 16 total sub-boards as shown in FIG. 6 can be calculated on trial as follows:

| | | |
|---|---|---|
| Successive placement of four types of chip components: | 3 sec. × 16 patterns = | 48 sec. |
| Nozzle change (S → M): | | 2 sec. |
| SOP Placement: | 1.5 sec. × 16 patterns | 24 sec. |
| Nozzle change (M → L): | | 2 sec. |
| QFP placement: | 1.5 sec. × 16 patterns = | 24 sec. |
| | Total: | 100 sec. |

EXAMPLE 2

Next, a mounting operation by an improved step repeat method is described as Example 2.

Figure 7:
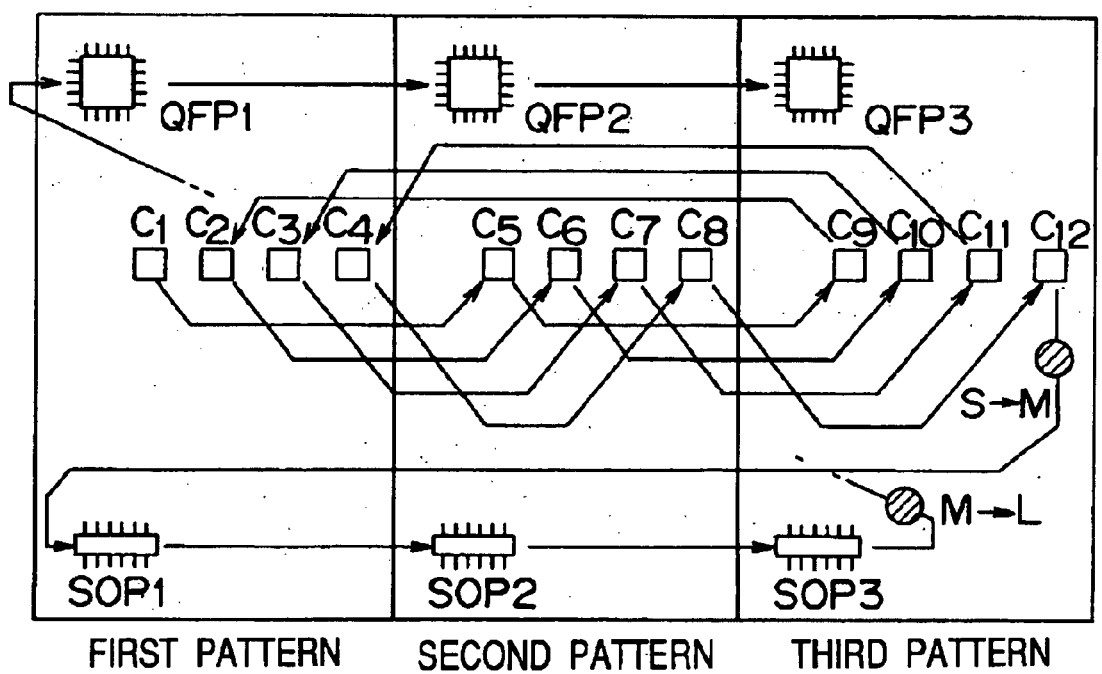
FIG. 7 is a view showing an order of placement of an improved step repeat method in an example of a multiple board composed of three sub-boards having an identical pattern.

In this improved step repeat method, the order of mounting of electronic components is similar to that of a conventional step repeat method as shown in FIG. 7, where mounting is performed in order of chip components→SOPs→QFPs as shown by arrows in FIG. 7. More specifically, as placement steps are shown sequentially in FIG. 8, first steps include sucking chip component C1 to the first placement head 38a, chip component C5 to the second placement head 38b, and chip component C9 to the third placement head 38c by S-size suction nozzles, respectively, either simultaneously or individually, moving the transfer head 28, and placing the chip components C1, C5, C9 onto respective sub-boards in this order. Similarly, steps following this include sucking chip components C2, C6, C10 by the placement heads 38a, 38b, 38c, placing these components onto respective sub-boards, and further sucking and placing components C3, C7, C11, and sucking and placing chip components C4, C8, C12.

Next, with the suction nozzle 34 of the first placement head 38a changed from S to M size, SOP1 is sucked by the suction nozzle 34 of the first placement head 38a and placed at a component placing position on the sub-board of a first pattern. Next, SOP2 is sucked by the first placement head 38a and placed onto the sub-board of a second pattern, and further SOP3 is sucked and placed onto the sub-board of a third pattern in a similar manner.

Then, with the suction nozzle 34 of the first placement head 38a changed from M to L size, QFPs 1–3 are placed successively onto respective sub-boards in a similar manner.

With this improved step repeat method, during placing of electronic components onto three sub-boards, a number of component suction operations can largely be reduced as compared with a step repeat method that involves one suction operation for each component, thereby allowing electronic components to be placed onto boards at high efficiency. Thus, mounting time can be shortened.

With this improved step repeat method, a mounting time for placing electronic components onto a multiple board having longitudinally 4×laterally 4, i.e. 16 total sub-boards as shown in FIG. 6, in a similar manner can be calculated on trial as follows:

| | | |
|---|---|---|
| Successive placement of one type of components: | (3 sec. × 4 patterns) × 4 types of components = | 48 sec. |
| Nozzle change (S → M): | | 2 sec. |

-continued

| | | |
|---|---|---|
| SOP placement: | 1.5 sec. × 16 patterns = | 24 sec. |
| Nozzle change (M → L): | | 2 sec. |
| QFP placement: | 1.5 sec. × 16 patterns = | 24 sec. |
| | Total: | 100 sec. |

EXAMPLE 3

Next, a mounting operation by a reversal method is described as Example 3. The reversal method refers to an improved version of the pattern repeat method, where order of use of suction nozzles for individual patterns is reversed from order of use of suction nozzles for one-preceding pattern.

Figure 9:
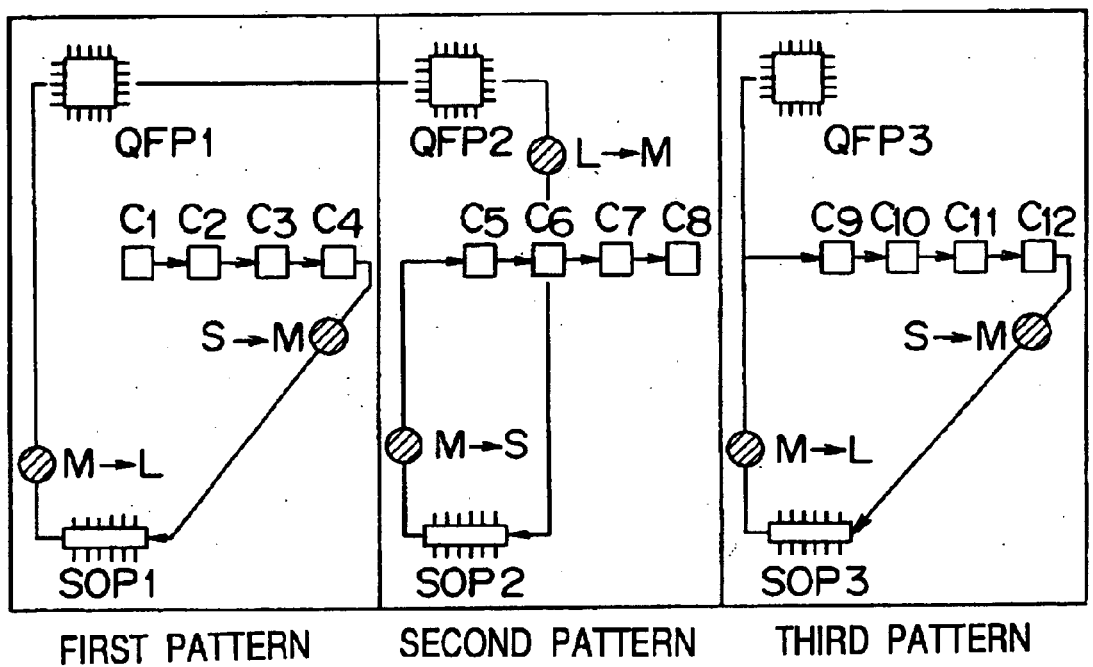
FIG. 9 is a view showing an order of placement of a reversal method in an example of a multiple board composed of three sub-boards having an identical pattern.

An order of mounting of components to be mounted according to this reversal method is described with reference to FIG. 9. An order of mounting for individual electronic components includes, as shown by arrows in FIG. 9, placing electronic components onto a sub-board of a first pattern, and then, as the suction nozzle that has been used at a time point of completion of this placement step remains unchanged, beginning a placement step for a second pattern.

More specifically, as placement steps are shown sequentially in FIG. 10, first steps include sucking chip component C1 by the first placement head 38a, chip component C2 by the second placement head 38b, chip component C3 by the third placement head 38c, and chip component C4 by the fourth placement head 38c by S-size suction nozzles, respectively, moving the transfer head 28 to component placing positions on the sub-board of the first pattern, and placing the chip components C1–C4 onto the board in this order. Thereafter, with the suction nozzle 34 of the first placement head 38a changed from S to M size, SOP1 is sucked by the first placement head 38a and placed at a component placing position on the sub-board of the first pattern. Subsequently, similarly, with the suction nozzle 34 of the first placement head 38a changed from M to L size, QFP1 is placed at a component placing position on the sub-board of the first pattern.

Next, placing of electronic components for a sub-board of a second pattern is performed, where, while the suction nozzle (L size) for QFP1, which has been last placed onto the sub-board of the first pattern, is used as it is without being changed, QFP2 is first placed onto the sub-board of the second pattern. Upon completion of placing of QFP2, SOP2 is placed with the suction nozzle changed from L to M size, and further the chip components C5–C8 are placed with the suction nozzle changed from M to S size.

Subsequently, for a sub-board of a third pattern, while the S-size suction nozzle is used as it is without being changed in a similar manner, chip components 9–12 are first placed onto the sub-board of the third pattern. Then, SOP3 and QFP3 are placed onto this sub-board.

Performing placement in this way eliminates a need for changing a suction nozzle upon completion of a placing step onto one sub-board, thereby allowing a number of changes of suction nozzles to be largely reduced. Thus, electronic components can be placed onto a board with high efficiency, and mounting time can be shortened.

With this reversal method, a mounting time for placing electronic components onto a multiple board having, longitudinally 4×laterally 4, 16 total sub-boards as shown in FIG. 6, in a similar manner can be calculated on trial as follows:

| Successive placement of four types of chip components: | |
|---|---|
| | 3 sec. |
| Nozzel change (S→M): | 2 sec. |
| SOP placement: | 1.5 sec. |
| Nozzle change (M→L): | 2 sec. |
| QFP placement: | 1.5 sec. |
| Sub-total: | 10 sec. |
| 10 sec. × 16 patterns = | 160 sec. |
| Total: | 160 sec. |

COMPARATIVE EXAMPLE 1

For comparison's sake, mounting times by the step repeat method and by the pattern repeat method are given below.

First, a mounting time for the step repeat method is as follows:

| | | |
|---|---|---|
| For one type of component: | 1.5 sec. × 16 patterns × 6 types of components = | 148 sec. |
| Nozzle change (S → M): | | 2 sec. |
| Nozzle change (M → L): | | 2 sec. |
| | Total: | 152 sec. |

COMPARATIVE EXAMPLE 2

Also, a mounting time by the pattern repeat method is as follows:

| | |
|---|---|
| Successive placement of four types of chip components: | 3 sec. |
| Nozzle change (S → M): | 2 sec. |
| SOP placement: | 1.5 sec. |
| Nozzle change (M → L): | 2 sec. |
| QFP placement: | 1.5 sec. |
| Nozzle change (On → S): | 2 sec. |
| Sub-total: | 12 sec. |
| (12 sec. × 16 patterns) – | 190 sec. |
| (last nozzle change: 2 sec.) = | |
| Total: | 190 sec. |

Table 1 lists mounting times for all individual mounting methods described above. As shown in Table 1, the task repeat method, the improved step repeat method, and the reversal method are capable of largely reducing a number of component suction operations as compared with the step repeat method, and of largely reducing a number of nozzle changes as compared with the pattern repeat method. Further, particularly with the task repeat method and the improved step repeat method, mounting time can be reduced remarkably, thereby allowing throughput of equipment to be improved.

It is noted that the mounting time shown in Table 1 is an example of trial calculation under above-described conditions, and when component mounting is performed under other different conditions, there are some cases where more remarkable mounting-time reduction effects can be obtained in terms of mounting time of the individual Examples as compared with the mounting times of the Comparative Examples.

TABLE 1

| | Mounting method | Number of Component suction operations | Number of times of nozzle change | Mounting time |
|---|---|---|---|---|
| Example 1 | Task repeat | 48 | 2 | 100 sec. |
| Example 2 | Improved Step repeat | 48 | 2 | 100 sec. |
| Example 3 | Reversal | 48 | 32 | 160 sec. |
| Comparative Example 1 | Step repeat | 96 | 2 | 152 sec. |
| Comparative Example 2 | Pattern repeat | 48 | 47 | 190 sec. |

(Second Embodiment)

Next, an electronic component mounting apparatus according to a second embodiment of the present invention is described.

Figure 11A:
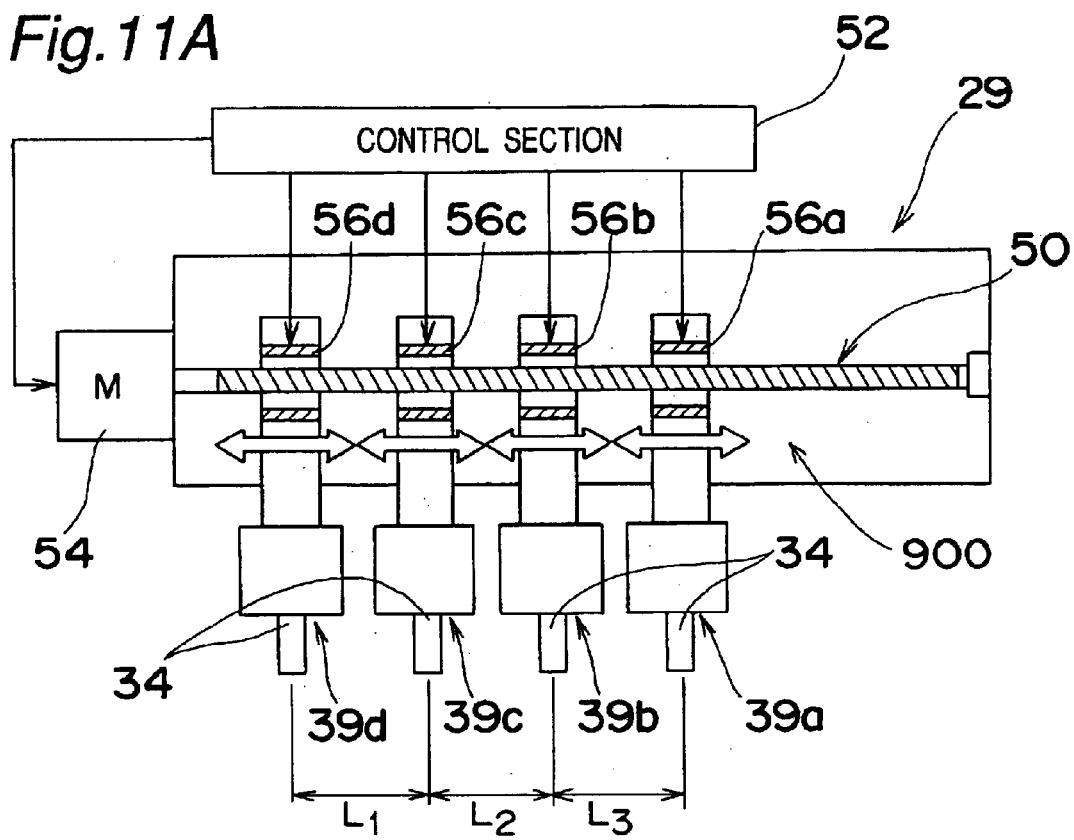
FIGS. 11A and 11B are a schematic arrangement view and a perspective view of a transfer head in a second embodiment of the present invention.

FIG. 11A is a schematic arrangement view showing construction of a transfer head 29 of the second embodiment. The transfer head 29 of the second embodiment is constructed from a placement-head moving mechanism 900 (one example of a component-holding-device moving mechanism) in which four placement heads, i.e. 39a, 39b, 39c, 39d, as examples of component holding devices having a ball screw mechanism, i.e. a ball screw 50, a motor 54, and clutches 56a, 56b, 56c, 56d are provided so as to be advanceable and retreatable each along one direction. The rest of the construction is the same as in the first embodiment.

Figure 11B:
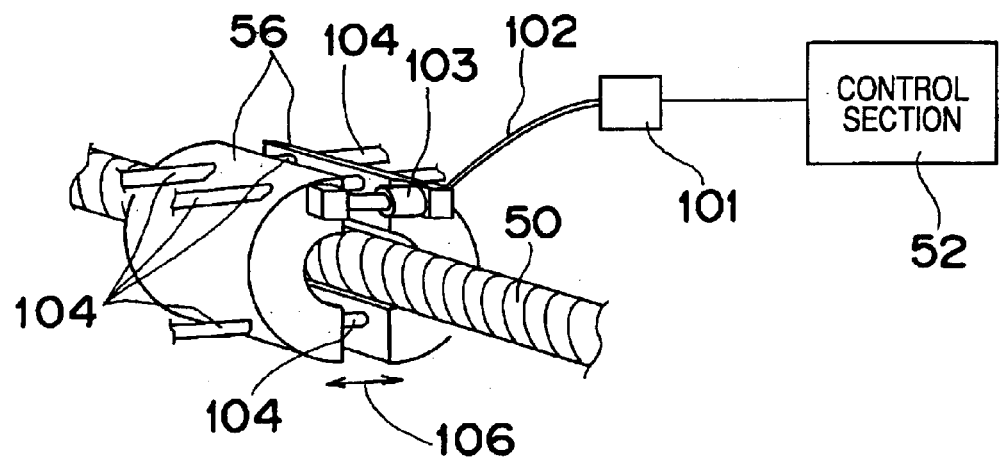

These placement heads can be moved to desired positions by controlling turn-on and -off of the motor 54 and the clutches 56a, 56b, 56c, 56d provided for the placement heads, respectively, according to instructions from control section 52, so that intervals $L_1$, $L_2$, $L_3$ between the placement heads can be controlled independently of one another, thereby allowing the intervals to be set to desired ones. FIG. 11B shows details of the clutches 56a–56d. The clutches 56a–56d are of the same structure and so illustrated as a clutch 56. The clutch 56, having a two-divided structure adapted to sandwich the ball screw 50 from both sides, is movable along four guides 104 parallel to one another in either direction indicated by an arrow 106 between an engagement position where the clutches 56 sandwich the ball screw 50 from both sides to be engaged with the ball screw 50, and a disengagement position where the clutches 56 separate from the ball screw 50 on both sides to be disengaged therefrom. Air is supplied to a cylinder 103 through an air pipe 102 by the control section 52 controlling turn-on and -off of an air valve 101 connected to an air supply source, and the clutch 56 is positioned at the engagement position to be engaged with the ball screw 50 or the disengagement position to be disengaged therefrom, by actuation of the cylinder 103. While the clutch 56 is engaged with the ball screw 50, the clutch 56 is advanced and retreated in an axial direction of the ball screw 50 by forward and reverse rotation of the ball screw 50 due to forward and reverse rotation of the motor 54.

Figure 12:
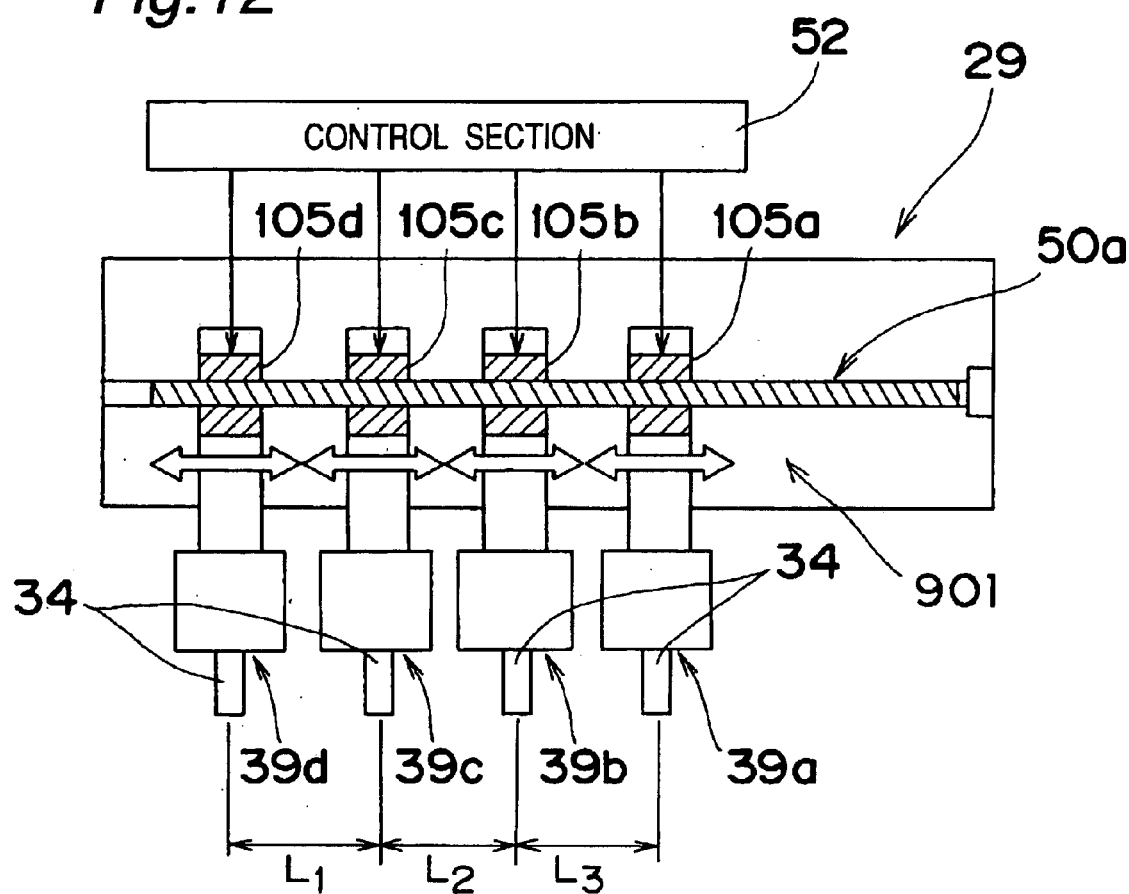
FIG. 12 is a schematic arrangement view showing another example of a placement-head moving mechanism of the transfer head of the second embodiment.

Also, a placement-head moving mechanism 901 shown in FIG. 12 may also be used as another example of the component-holding-device moving mechanism for changing distances, or array interval, of the placement heads 39a–39d. In the arrangement shown in FIG. 12, a ball screw 50a is non-rotatably fixed, where reference numerals 105a, 105b, 105c, 105d denote hollow motors which engage with the ball screw 50a by themselves and rotate around the ball screw 50a. Under control by the control section 52, the hollow motors 105a–105d are actuated individually and independently of one another, making the placement heads 39a–39d advance and retreat along the ball screw 50a individually and independently, by which intervals between the placement heads 39a–39d can be adjusted.

By virtue of the arrangement that intervals between individual placement heads are made variable as shown above, the following effects can be produced.

Figure 13A:
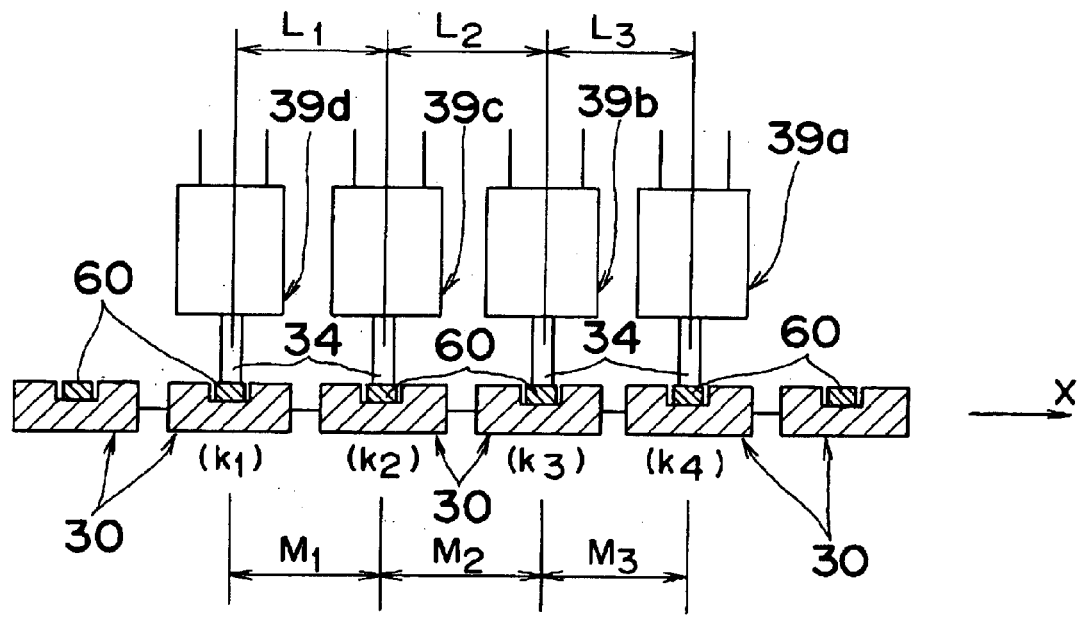
FIGS. 13A and 13B are views showing a relationship between an array interval of component feeders and an array interval of placement heads.

First of all, given that array intervals of component arrays of component feeders 30 that feed electronic components are $M_1$, $M_2$, $M_3$ as shown in FIG. 13A, intervals $L_1$, $L_2$, $L_3$ of the placement heads can be made coincident with the array intervals $M_1$, $M_2$, $M_3$ of the component feeders 30. As a result of this, during sucking of electronic components 60 by suction nozzles 34, the electronic components can be sucked by the suction nozzles 34 of all the placement heads simultaneously and collectively. In more detail, as shown in FIG. 2, by simultaneously driving the actuators 40 of all the placement heads to thereby lower all the suction nozzles 34 simultaneously and collectively, four electronic components can be sucked and held simultaneously and collectively by the four suction nozzles 34. Also, by driving the actuators 40 of all the placement heads not simultaneously, but sequentially one by one, to thereby lower all the suction nozzles 34 sequentially and in succession, the four electronic components can be sucked and held sequentially by the four suction nozzles 34 without moving the placement heads within the X-Y plane.

Figure 13B:
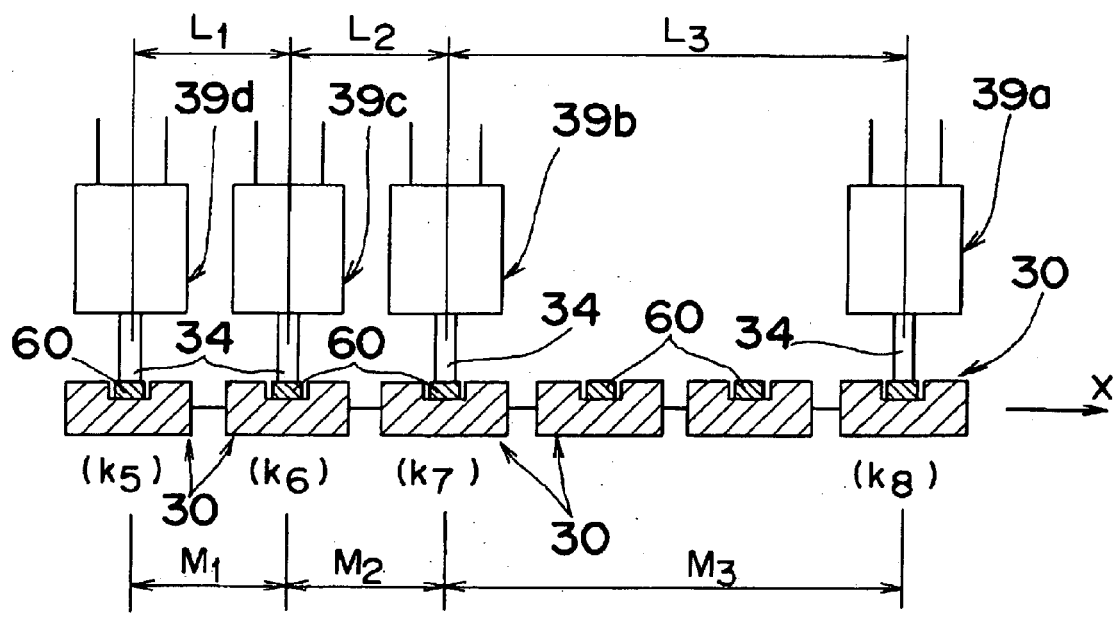

Also, even when component feeders 30 of electronic components to be placed are not adjoining, that is, a component is sucked also from a component feeder 30 apart therefrom by the interval $M_3$ beyond component feeders 30 that are not targeted for component suction as shown in FIG. 13B, electronic components can be sucked simultaneously even from this distant component feeder 30 by appropriately changing an interval ($L_3$ in the figure) between the placement head 39a and the placement head 39b so that the interval becomes coincident with the interval $M_3$.

Therefore, suction of components by individual suction nozzles 34 can be completed by a one-time simultaneous up-and-down motion of the individual placement heads, so that component suction time can considerably be shortened, compared with an arrangement that components are sucked one by one for each suction nozzle 34.

Secondly, during placing of electronic components held by suction nozzles onto a circuit board, as shown in FIG. 14, placement of electronic components 60 onto the circuit board can be completed by a one-time simultaneous up-and-down motion of individual placement heads by virtue of an arrangement that intervals $L_1$, $L_2$, $L_3$ of the placement heads are made coincident with component array intervals $N_1$, $N_2$, $N_3$, respectively, of the electronic components to be placed, i.e., that $L_1=N_1$, $L_2=N_2$, and $L_3=N_3$. In more detail, as shown in FIG. 2, by simultaneously driving the actuators 40 of all the placement heads to thereby lower all the suction nozzles 34 simultaneously and collectively, four electronic components can be placed onto the circuit board 12 simultaneously and collectively by the four suction nozzles 34. Also, by driving the actuators 40 of all the placement heads not simultaneously, but sequentially one by one, to thereby lower all the suction nozzles 34 sequentially and in succession, the four electronic components can be placed onto the circuit board 12 sequentially by the four suction nozzles 34 without moving the placement heads within the X-Y plane.

As a result of this, component placing time can considerably be shortened. It is noted here that FIG. 14A shows a case where intervals of suction nozzles and intervals of electronic components are equal to one another ($L_1=L_2=L_3=N_1=N_2=N_3$), and FIG. 14B shows a case where component intervals are different from one another.

Figure 14A:
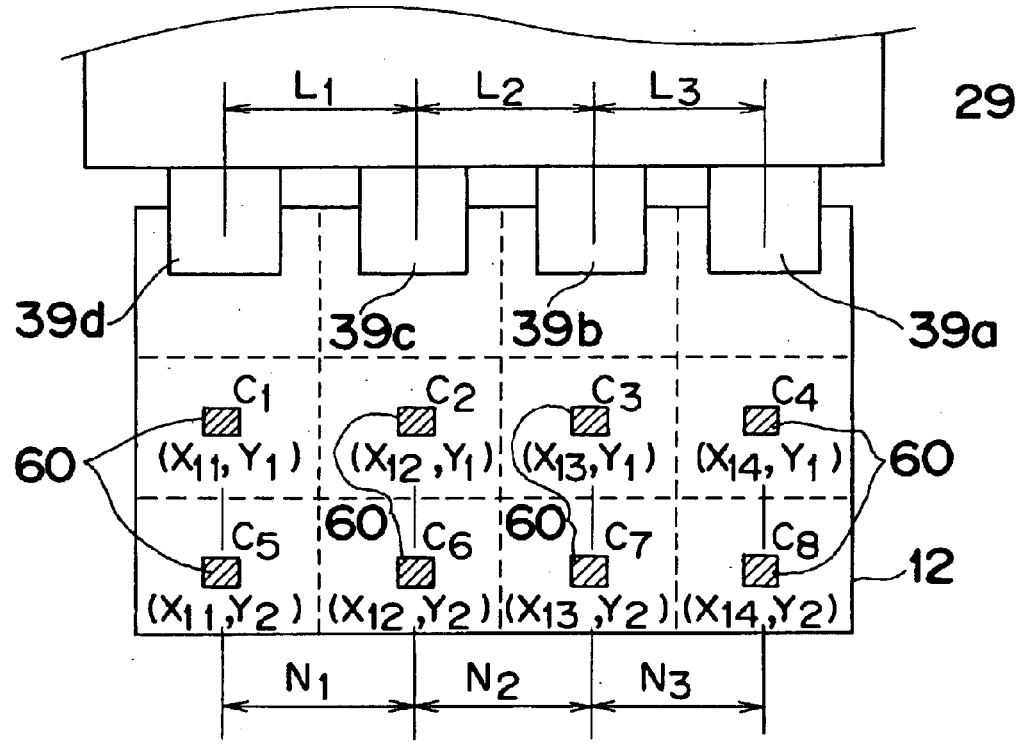
FIGS. 14A and 14B are views showing a relationship between an interval of electronic-component placing positions on a circuit board and an array interval of placement heads.
Figure 14B:
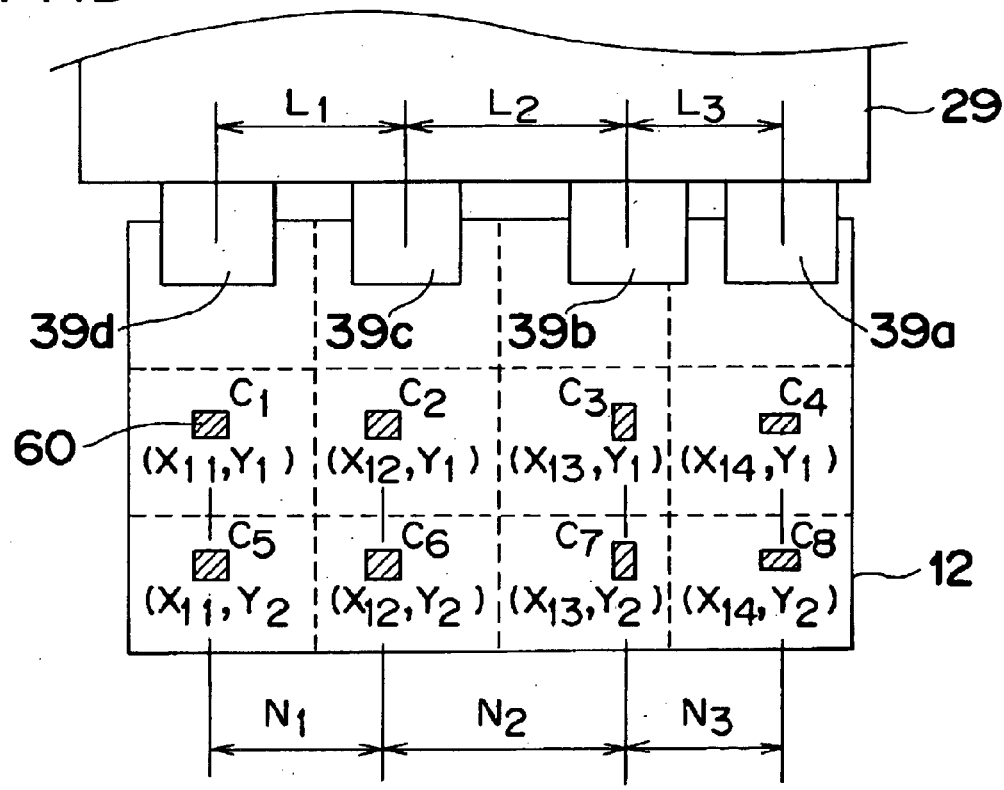

In this case, whereas electronic components can be mounted most efficiently by sucking and holding the electronic components by the placement heads in the state shown in FIG. 13A, and then placing the electronic components onto the board as shown in FIG. 14A, performing component placing by, for example, sucking electronic components in the state of FIG. 13A and then moving the electronic components to the placement head positions shown in FIG. 14B during movement of the transfer head 29 leads to an improvement in mounting cycle time.

Figure 21:
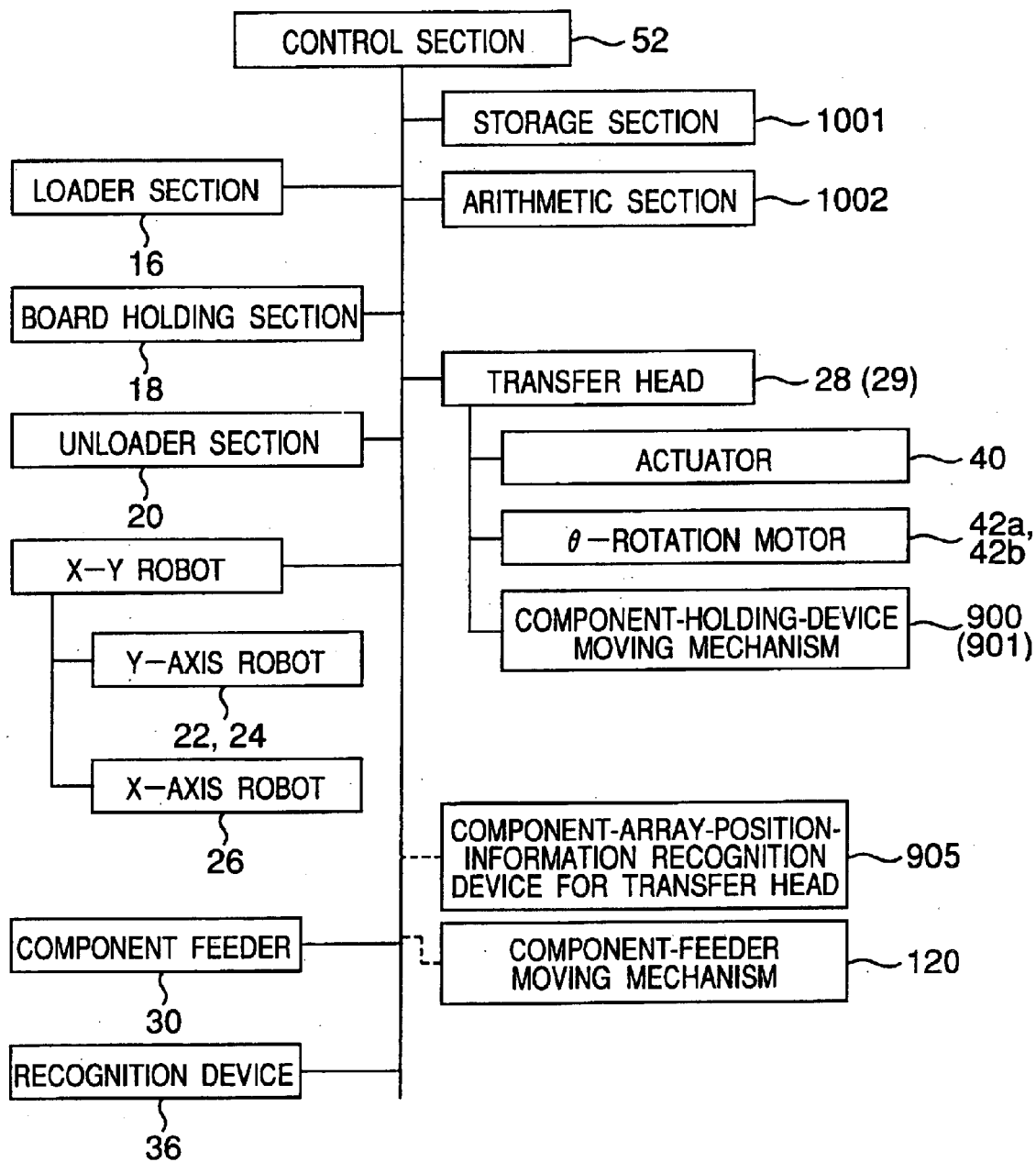
FIG. 21 is a block diagram related to a control section of the component mounting apparatus according to the foregoing embodiment of the present invention.

Intervals between the placement heads at such component feed positions as shown in FIG. 13A, and intervals between the placement heads at such component placing positions as shown in FIG. 14A are set by designating X and Y coordinates of component feed positions and X and Y coordinates of placement positions with an NC program shown in FIG. 15 and previously stored in the storage section 1001 of FIG. 21, reading these X and Y coordinates by control of the control section 52, and calculating with an arithmetic section 1002 of FIG. 21. The NC program is a program for sequentially instructing operations of component mounting for the component mounting apparatus. For example, in a case where the X-coordinates of component feed positions read from the storage section 1001 are k1 for the placement head 39d, k2 for the placement head 39c, k3 for the placement head 39b, and k4 for the placement head 39a at steps Nos. 1–4, intervals $L_1$, $L_2$, $L_3$ between the placement heads are determined by the arithmetic section 1002 so that individual placement heads become coincident with the designated component feed positions. In this case, the arithmetic section 1002 performs calculations of $L_1=k_2-k_1$, $L_2=k_3-k_2$, $L_3=k_4-k_3$ to determine the intervals $L_1$, $L_2$, $L_3$ between the placement heads.

Also, in a case where the X-coordinates of component placing positions read from the storage section 11001 are $X_{11}$ for the placement head 39d, $X_{12}$ for the placement head 39c, $X_{13}$ for the placement head 39b, and $X_{14}$ for the placement head 39a at steps Nos. 1–4 of FIG. 15, intervals $L_1$, $L_2$, $L_3$ between the placement heads are determined by the arithmetic section 1002 so that individual placement heads become coincident with designated component placing positions. In this case, the arithmetic section 1002 performs calculations of $L_1=X_{12}-X_{11}$, $L_2=X_{13}-X_{12}$, $L_3=X_{14}-X_{13}$ to determine the intervals $L_1$, $L_2$, $L_3$ between the placement heads.

It is noted here that although a change of intervals between the placement heads at the component feed positions may be performed at the component feed positions, performing a change of the intervals between the placement heads during movement of the transfer head 29 subsequent to placing of one-preceding component allows an improvement in mounting cycle time to be achieved. It is noted that although intervals between the placement heads during component suction and component placement operations are determined through calculations by the arithmetic section 1002 based on X and Y coordinates of component feed positions and X and Y coordinates of placement positions in the above example, it is also possible to previously store intervals of the component feeders 30 and/or intervals of placement positions in the storage section 1001 so that a placement-head adjustment operation can be performed only by reading those intervals without any arithmetic processing. In summary, it is required only that array information, concretely, interval or positional information as to the component feeders 30 or placement positions be stored in the storage section 1001.

Also, changing of intervals between the placement heads at a component feed position may also be obtained by recognizing component array positional information as to marks or the like provided on the component feeders 30 with a camera or sensor or other recognition device 905 (one example of component-array-position-information recognition devices) provided on the transfer head 28 or 29, and performing arithmetic processing with the arithmetic section 1002 to thereby obtain intervals of the component feeders 30, and adjusting intervals between the placement heads so that these intervals are adjusted to obtained intervals of the component feeders 30.

Similarly, it is also possible that with electronic components sucked and held in the state shown in FIG. 13B, component placement is performed by moving the components to placement-head positions shown in FIGS. 14A and 14B.

In any of the above-described cases, component suction or component placement for all the placement heads can be completed by a simultaneous one-time up-and-down motion of the placement heads, so that component mounting time can largely be shortened.

In addition, a placement-head moving mechanism for moving the placement heads to adjust intervals of the placement heads may be not only a ball screw mechanism but also any device that can maintain travel speed and precision. Further, although the transfer head in the first and second embodiments has a quadruple-placement-head structure, the present invention is not limited to this and may be structured so as to have any arbitrary number of placement heads.

The first and second embodiments have been shown above in an arrangement that array intervals of the placement heads are adjusted so as to be respectively coincident with array intervals of the component feeders 30, or intervals of electronic-component placing positions on the circuit board. However, without being limited to this, it may also be arranged, for example, that array intervals of the component feeders 30 are adjusted by a component-feeder moving mechanism (one example of component-feed-section moving mechanisms) on the basis of array intervals of individual placement heads, or that intervals of electronic-component placing positions on the circuit board are design-changed. By so doing, the placement-head moving mechanism on a transfer-head side becomes unnecessary, thereby allowing the transfer head to be reduced in weight and a travel speed to be enhanced, so that higher-speed mounting becomes achievable.

Figure 16:
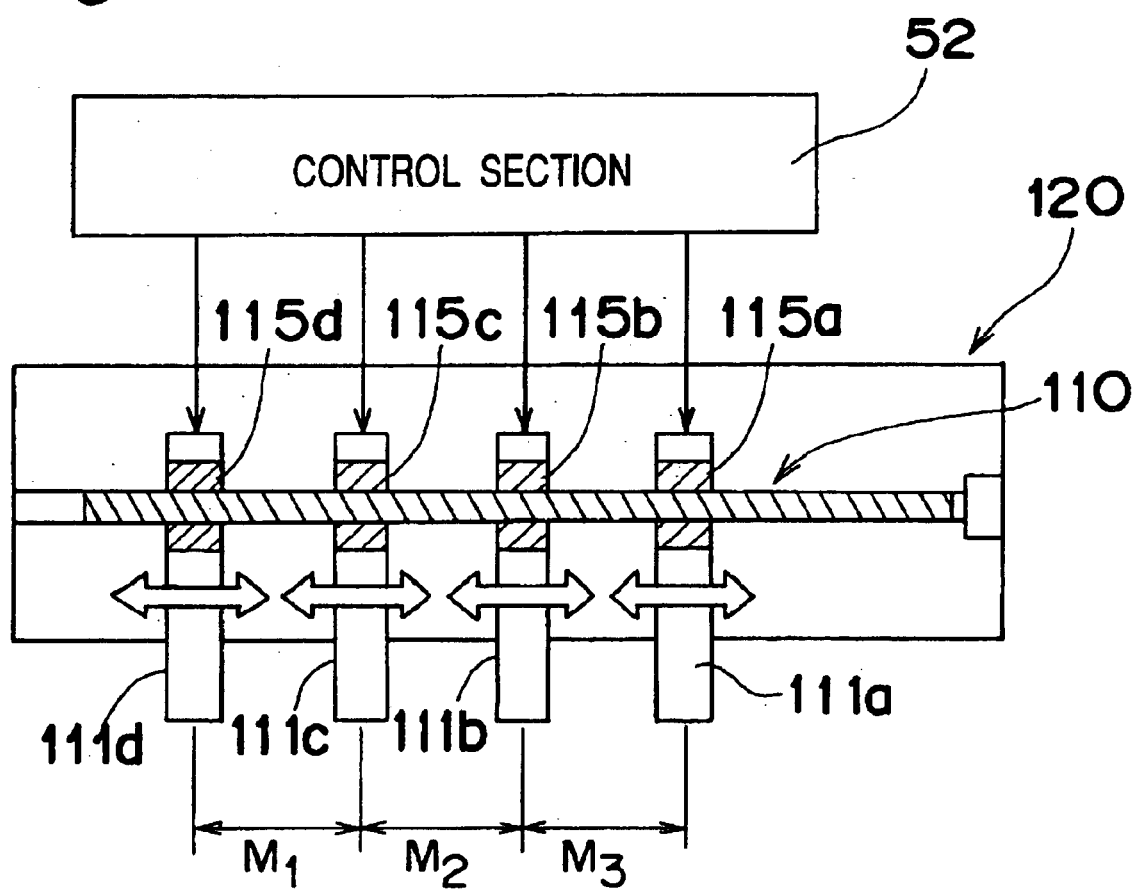
FIG. 16 is a schematic arrangement view showing a component-feeder moving mechanism in the component mounting apparatus according to the foregoing embodiment of the present invention.
Figure 18:
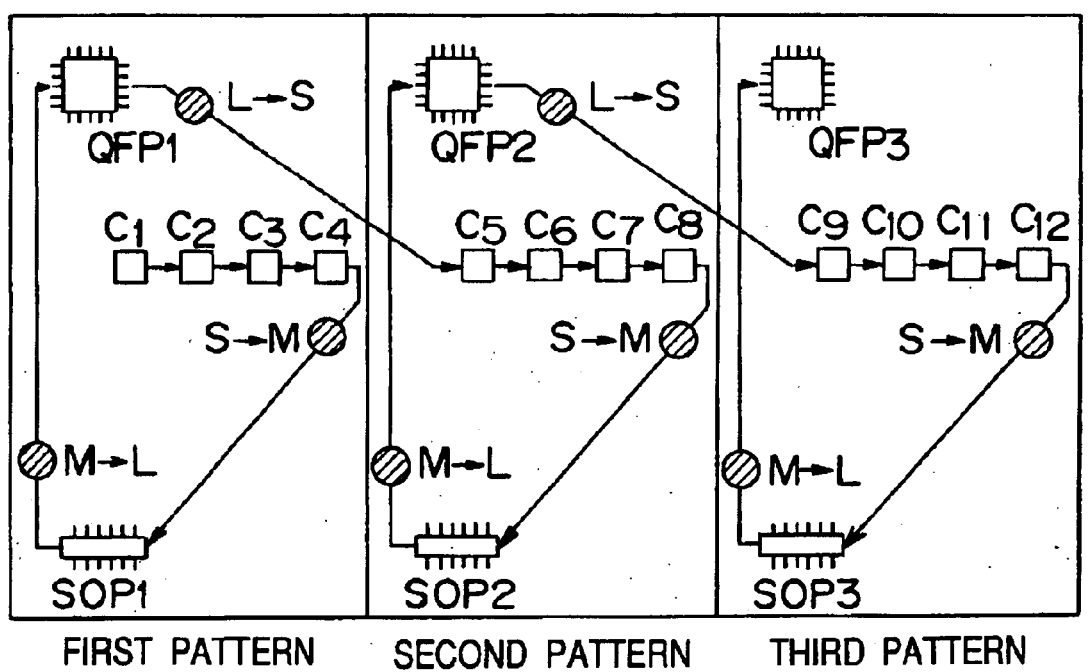
FIG. 18 is a view showing an order of placement of a conventional pattern repeat method in an example of a multiple board composed of three sub-boards having an identical pattern.
Figure 20A:
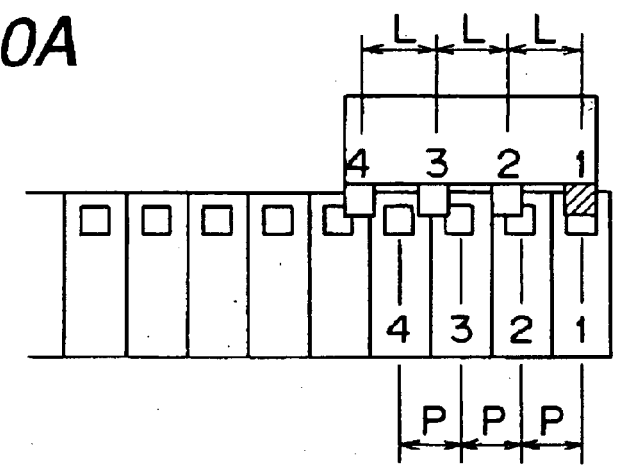
FIGS. 20A, 20B, 20C, and 20D are views showing respective states of a component placement operation performed by suction nozzles via a vertical motion of the suction nozzles.
Figure 20B:
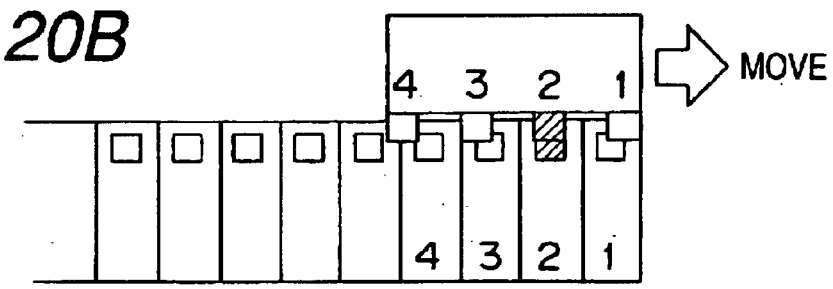
Figure 20C:
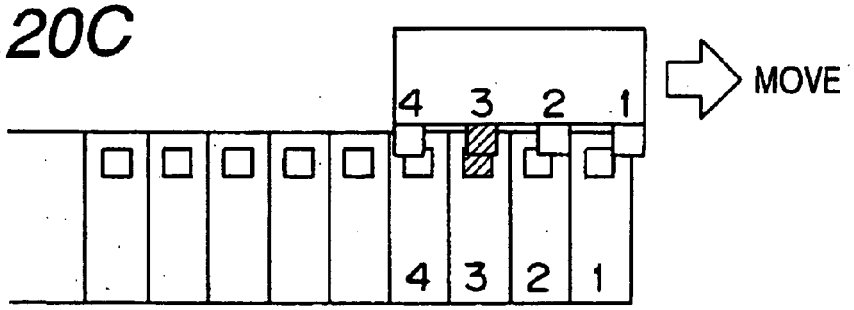
Figure 20D:
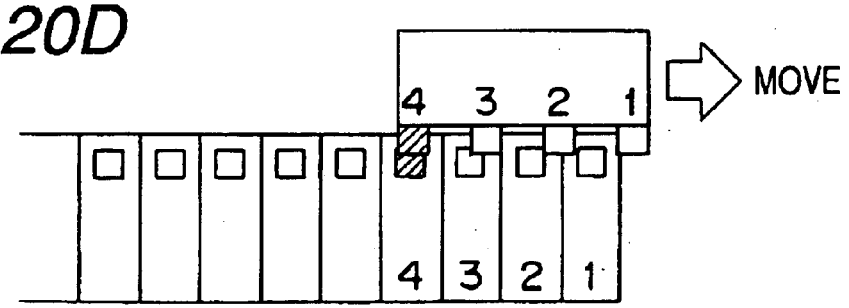

FIG. 16 shows a concrete example of a component-feeder moving mechanism 120 (one example of component-feed-section moving mechanisms) for changing array intervals of the component feeders 30. In the component-feeder moving mechanism 120, feeder stands 111a, 111b, 111c, 111d for setting thereon the component feeders 30 respectively are advanceable and retreatable along a non-rotatably fixed ball screw 110. Inside the feeder stands 111a–111d, are provided hollow motors 115a–115d which rotate around the ball screw 110, respectively. The hollow motors 115a–115d are operated individually and independently of one another by control from control section 52, by which the feeder stands 111a–111d are advanced and retreated along the ball screw 110 individually and independently, so that array intervals M1, M2, M3 of the component feeders 30 can be changed so as to be coincident with intervals between adjacent placement heads.

Further, if heights of individual placement heads can be adjusted vertically so as to be coincident with heights of components, the components can be sucked or placed while lowering extents for the individual placement heads are adjusted to optimum positions according to the heights of the components.

According to the component mounting method and the component mounting apparatus of the present invention, during a process of mounting components onto a multiple board, (1) a change of suction nozzles is performed after a placement step of placing onto the board all components that can be held by an identical suction nozzle has been applied to all sub-boards, which makes it possible to suppress a number of times of change of suction nozzles to a minimum;

(2) after a placement step of placing components onto individual sub-boards successively with components of an identical type held by the suction nozzles, respectively, has been applied to all the sub-boards, a working step moves to a next placement step, which makes it possible to replace an operation of repeating suction and component placement for one component with an operation of previously sucking plural components all at one time and placing the components onto a board; and (3) when placement of components onto one sub-board is completed and succeeded by placement of components onto a next sub-board, a suction nozzle that is last used for a placement-completed sub-board is used as it is for the next sub-board, which makes it possible to reduce a number of time of changes of suction nozzles.

By these methods of (1) to (3), mounting operation can be performed efficiently so as to be free from any waste. Thus, component mounting time can be shortened and throughput of equipment can be improved.

Further, by virtue of an arrangement that component array intervals of the component feed section or intervals of component placement positions on the board are made coincident with array intervals of the component holding devices of the transfer head, components can be held by the component holding devices by a simultaneous one-time up-and-down motion of the component holding devices during removal of components from the component feed section. Also, during placing onto a circuit board components held by the component holding devices, the components can be placed at desired positions on the circuit board by a simultaneous one-time up-and-down motion of the component holding devices. Thus, component mounting time can greatly be shortened.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting method comprising:

for each one of a plurality of sub-boards, with said plurality of sub-boards defining a multiple board and each of said plurality of sub-boards having an identical circuit pattern, (i) using identical removable suction nozzles, of component holding devices movable in an X-Y plane, to simultaneously pick up components or individually pick up components such that said components are held by said suction nozzles; and then (ii) placing said components onto said one of said plurality of sub-boards; then replacing one of said suction nozzles with another suction nozzle; and then using said another suction nozzle to mount other components onto said each one of said plurality of sub-boards.

2. A component mounting method comprising:

for a plurality of sub-boards, with said plurality of sub-boards defining a multiple board and each of said plurality of sub-boards having an identical circuit pattern, (i) using removable suction nozzles, of component holding devices movable in an X-Y plane, to simultaneously pick up components of an identical type or individually pick up components of an identical type such that said components are held by said suction nozzles; and then (ii) successively placing said components onto ones of said plurality of sub-boards, respectively; and then mounting other components onto said ones of said plurality of sub-boards.

3. A component mounting apparatus comprising:

component holding devices movable in an X-Y plane, said component holding devices having identical removable suction nozzles, with said component holding devices being constructed and arranged for (i) for each one of a plurality of sub-boards, with the plurality of sub-boards defining a multiple board and each of the plurality of sub-boards having an identical circuit pattern;

(a) allowing said suction nozzles to simultaneously pick up components or individually pick up components such that these components are held by said suction nozzles; and then (b) allowing said suction nozzles to place the components onto the one of the plurality of sub-boards; then (ii) allowing one of said suction nozzles to be replaced with another suction nozzle; and then (iii) allowing the another suction nozzle to mount other components onto each one of the plurality of sub-boards.

4. A component mounting method comprising:

(i) moving a transfer head on which are mounted component holding devices;

(ii) using said component holding devices to hold components received from a component feed section having arrayed thereon a plurality of components; and then (iii) lowering said component holding devices over component placement positions of a circuit board so as to place said components onto said circuit board, wherein prior to either one of (ii) and (iii), said component holding devices are moved independently of one another so as to adjust intervals between adjacent ones of said component holding devices such that these intervals become coincident, respectively, with different array intervals intended for said components, which different array intervals correspond to a respective either one of the holding of said components by said component holding devices and the placing of said components onto said circuit board via lowering of said component holding devices.

5. The component mounting method according to claim 4, wherein prior to (ii), said component holding devices are moved independently of one another so as to adjust intervals between said adjacent ones of said component holding devices such that these intervals become coincident, respectively, with said different array intervals intended for said components, which are array positional intervals of component array of said component feed section.

6. The component mounting method according to claim 4, wherein prior to (iii), said component holding devices are moved independently of one another so as to adjust intervals between said adjacent ones of said component holding devices such that these intervals become coincident, respectively, with said different array intervals intended for said components, which are array positional intervals of said component placement positions on said circuit board.

7. The component mounting method according to claim 4, further comprising:

prior to said component holding devices being moved independently of one another so as to adjust intervals between adjacent ones of said component holding devices, obtaining array positional information intended for said components and using this obtained array positional information to determine intended intervals between said adjacent ones of said component holding devices, wherein moving of said component holding devices independently of one another so as to adjust intervals between said adjacent ones of said component holding devices results in said intervals between said adjacent ones of said component holding devices becoming equal to said intended intervals.

8. The component mounting method according to claim 7, wherein obtaining array positional information intended for said components comprises reading array positional information, intended for said components, previously stored in a storage device.

9. The component mounting method according to claim 7, wherein obtaining array positional information intended for said components comprises obtaining array positional information, intended for said components, as recognized by a component-array-positional-information recognition device of said transfer head.

10. The component mounting method according to claim 4, wherein moving of said component holding devices independently of one another so as to adjust intervals between said adjacent ones of said component holding devices occurs during movement of said transfer head.

11. A component mounting method comprising:

(i) moving a transfer head on which are mounted component holding devices;

(ii) using said component holding devices to hold components received from component feed sections having arrayed thereon a plurality of components; and then (iii) lowering said component holding devices over component placement positions of a circuit board so as to place said components onto said circuit board, wherein prior to (ii), said component feed sections are moved such that intervals of said component feed sections become coincident with intervals between adjacent ones of said component holding devices.

12. A component mounting apparatus comprising:

a movable transfer head on which are mounted component holding devices, said transfer head being constructed and arranged for (i) allowing said component holding devices to hold components received from a component feed section having arrayed thereon a plurality of components; and then (ii) allowing said component holding devices to be lowered over component placement positions of a circuit board so as to place the components onto the circuit board;

a component-holding-device moving mechanism on said transfer head and operable to move said component holding devices so as to adjust array intervals of said component holding devices independently of one another; and a control section for (i) prior to either one of (a) said component holding devices holding the components received from the component feed section; and (b) said component holding devices being lowered over the component placement positions of the circuit board, causing said component-holding-device moving mechanism to be driven so as to move said component holding devices independently of one another such that respective intervals between adjacent ones of said component holding devices are set to desired intervals which are coincident with array intervals intended for the components, which array intervals correspond to a respective either one of the holding of the components by said component holding devices and the placing of the components onto the circuit board via lowering of said component holding devices, and then (ii) causing said component holding devices to hold the components received from the component feed section when the array intervals intended for the components correspond to the holding of the components by said component holding devices; and (iii) causing said component holding devices to be lowered over the component placement positions of the circuit board when the array intervals intended for the components correspond to the placing of the components onto the circuit board via lowering of said component holding devices.

13. The component mounting apparatus according to claim 12, wherein said control section is for prior to said component holding devices holding components received from the component feed section, causing said component-holding-device moving mechanism to be driven so as to move said component holding devices independently of one another such that the respective intervals between the adjacent ones of said component holding devices are set to the desired intervals which are coincident with the array intervals, intended for the components, that correspond to the holding of the components by said component holding devices, which array intervals are array positional intervals of component array of the component feed section, and then causing said component holding devices to hold the components received from the component feed section.

14. The component mounting apparatus according to claim 12, wherein said control section is for prior to said component holding devices being lowered over the component placement positions of the circuit board, causing said component-holding-device moving mechanism to be driven so as to move said component holding devices independently of one another such that the respective intervals between the adjacent ones of said component holding devices are set to the desired intervals which are coincident with the array intervals, intended for the components, that correspond to the placing of the components onto the circuit board via lowering of said component holding devices, which array intervals are array positional intervals of the component placement positions on the circuit board, and then causing said component holding devices to be lowered over the component placement positions of the circuit board.

15. The component mounting apparatus according to claim 12, further comprising:

an arithmetic section for, prior to said component-holding-device moving mechanism being driven so as to move said component holding devices independently of one another, determining intended array intervals for the components based upon array positional information intended for the components, which intended array intervals correspond to a respective either one of the holding of the components by said component holding devices and the placing of the components onto the circuit board via lowering of said component holding devices, wherein said control section is for causing said component-holding-device moving mechanism to be driven so as to move said component holding devices independently of one another such that the respective intervals between the adjacent ones of said component holding devices are set to the desired intervals, with the desired intervals being equal to the intended array intervals.

16. The component mounting apparatus according to claim 15, further comprising:

a storage device for previously storing the array positional information intended for the components, wherein said arithmetic section is for determining the intended array intervals for the components based upon the array positional information as read from said storage device.

17. The component mounting apparatus according to claim 15, further comprising:

a component-array-positional-information recognition device on said transfer head and operable for recognizing component array positional information corresponding to the component placement positions, wherein said arithmetic section is also for determining intended intervals between said adjacent ones of said component holding devices based upon the component array positional information as recognized by said component-array-positional-information recognition device.

18. The component mounting apparatus according to claim 12, wherein said control section is for causing said component-holding-device moving mechanism to be driven so as to move said component holding devices independently of one another while said transfer head is moving.

19. A component mounting apparatus comprising:

a movable transfer head on which are mounted component holding devices, said transfer head being constructed and arranged for (i) allowing said component holding devices to hold components received from component feed sections having arrayed thereon a plurality of components; and then (ii) allowing said component holding devices to be lowered over component placement positions of a circuit board so as to place the components onto the circuit board;

a component-feed-section moving mechanism for moving said component feed sections; and a control section for (i) prior to said component holding devices holding the components received from the component feed sections, causing said component-feed-section moving mechanism to be driven so as to move said component feed sections such that intervals between adjacent ones of said component feed sections are adjusted and become coincident with intervals between adjacent ones of said component holding devices; and then (ii) causing said component holding devices to hold the components received from the component feed sections.

\* \* \* \* \*